US011127896B2

(12) United States Patent
Alam et al.

(10) Patent No.: US 11,127,896 B2
(45) Date of Patent: Sep. 21, 2021

(54) SHARED SPIN-ORBIT-TORQUE WRITE LINE IN A SPIN-ORBIT-TORQUE MRAM

(71) Applicant: Everspin Technologies, Inc., Chandler, AZ (US)

(72) Inventors: Syed M. Alam, Austin, TX (US); Thomas Andre, Austin, TX (US); Frederick Mancoff, Chandler, AZ (US); Sumio Ikegawa, Phoenix, AZ (US)

(73) Assignee: Everspin Technologies, Inc., Chandler, AZ (US)

( * ) Notice: Subject to any disclaimer, the term of this patent is extended or adjusted under 35 U.S.C. 154(b) by 0 days.

(21) Appl. No.: 16/251,230

(22) Filed: Jan. 18, 2019

(65) Prior Publication Data
US 2020/0235289 A1      Jul. 23, 2020

(51) Int. Cl.
*H01L 43/08*     (2006.01)
*G11C 11/16*     (2006.01)
*H01L 27/22*     (2006.01)
*H01L 43/02*     (2006.01)
*H01L 43/10*     (2006.01)

(52) U.S. Cl.
CPC ............ *H01L 43/08* (2013.01); *G11C 11/161* (2013.01); *H01L 27/222* (2013.01); *H01L 43/02* (2013.01); *H01L 43/10* (2013.01)

(58) Field of Classification Search
CPC ............... H01L 27/115; H01L 27/2436; H01L 27/2409; H01L 45/16; H01L 45/144; H01L 45/1233; H01L 45/06; H01L 45/126; H01L 27/11521; H01L 43/08; H01L 43/10; H01L 43/02; H01L 27/222; G11C 11/161
See application file for complete search history.

(56) References Cited

U.S. PATENT DOCUMENTS

| | | |
|---|---|---|
| 8,686,484 B2 | 4/2014 | Whig et al. |
| 8,747,680 B1 | 6/2014 | Deshpande et al. |
| 9,023,216 B2 | 5/2015 | Kochergin et al. |
| 9,136,464 B1 | 9/2015 | Whig et al. |
| 9,419,208 B2 | 8/2016 | Whig et al. |

(Continued)

OTHER PUBLICATIONS

A. R. Sitaram et al., "A 0.18 /spl mu/m logic-based MRAM technology for high performance nonvolatile memory applications," 2003 Symposium on VLSI Technology. Digest of Technical Papers (IEEE Cat. No. 03CH37407), Kyoto, Japan, 2003, pp. 15-16, doi: 10.1109/VLSIT.2003.1221063.

(Continued)

*Primary Examiner* — Mohammed R Alam
(74) *Attorney, Agent, or Firm* — Bookoff McAndrews, PLLC

(57) ABSTRACT

The present disclosure is drawn to, among other things, a magnetoresistive memory. The magnetoresistive memory comprises a plurality of magnetoresistive memory devices, wherein each magnetoresistive memory device includes a fixed magnetic region, a free magnetic region, and an intermediate region disposed in between the fixed and free magnetic regions. The magnetoresistive memory further comprises a first conductor extending adjacent each magnetoresistive memory device of the plurality of magnetoresistive devices, wherein the first conductor is in electrical contact with the free magnetic region of each magnetoresistive memory device.

5 Claims, 20 Drawing Sheets

(56) References Cited

U.S. PATENT DOCUMENTS

| | | | |
|---|---|---|---|
| 2003/0123197 A1 | 7/2003 | Mizuguchi et al. | |
| 2007/0164265 A1* | 7/2007 | Kajiyama | H01L 27/228 257/3 |
| 2015/0200003 A1* | 7/2015 | Buhrman | G11C 11/18 365/158 |
| 2016/0351238 A1* | 12/2016 | Doyle | G11C 11/161 |
| 2017/0140804 A1* | 5/2017 | Apalkov | G11C 11/161 |
| 2017/0169872 A1* | 6/2017 | Yoda | G11C 11/1675 |
| 2018/0158498 A1 | 6/2018 | Aggarwal et al. | |
| 2018/0174635 A1* | 6/2018 | Yoda | G11C 11/161 |
| 2019/0006415 A1* | 1/2019 | Li | G11C 11/1675 |
| 2019/0189912 A1* | 6/2019 | Ebrahimi | H01L 43/02 |

OTHER PUBLICATIONS

International Search Report and Written Opinion dated Jul. 29, 2020 in International Application No. PCT/US2020/013329 (18 pages).
W. J. Gallagher and S. S. P. Parkin, "Development of the magnetic tunnel junction MRAM at IBM: From first junctions to a 16-Mb MRAM demonstrator chip," in IBM Journal of Research and Development, vol. 50, No. 1, pp. 5-23, Jan. 2006, doi: 10.1147/rd.501.0005.

\* cited by examiner

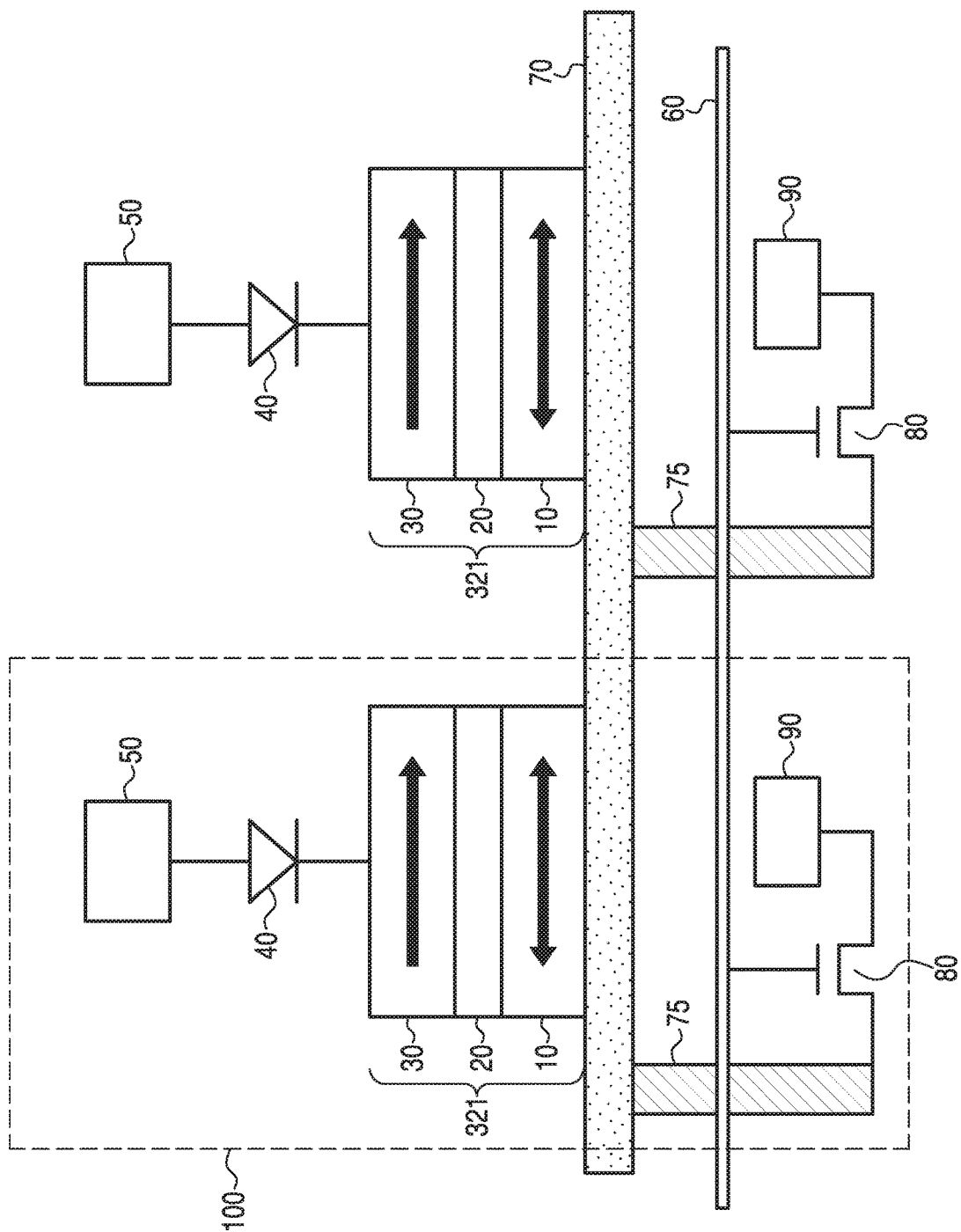

SHARED SPIN-ORBIT-TORQUE WRITE LINE IN A SPIN-ORBIT-TORQUE MRAM

TECHNICAL FIELD

The disclosure herein relates generally to spin-orbit-torque magnetoresistive memory devices having one magnetic tunnel junction and one or more corresponding select devices in each memory cell, and more particularly, to circuits and methods for accessing such memory cells for read and write operations.

INTRODUCTION

Spin-orbit-torque (SOT) magnetoresistive random access memory (MRAM) devices store information by controlling the resistance across a magnetic tunnel junction (MTJ) such that a read current through the MTJ results in a voltage drop having a magnitude that is based on the state of the MTJ stack. The resistance in an MTJ stack can be varied based on the relative magnetic states of the magnetoresistive layers within the MTJ stack. In such memory devices, there is typically a portion of the MTJ stack that has a fixed magnetic state (i.e., fixed region) and another portion that has a free magnetic state (i.e., free region) that is controlled to be in either of two possible states relative to the portion having the fixed magnetic state. Because the resistance through the MTJ stack changes based on the orientation (i.e., magnetization direction) of the free region relative to the fixed region, information can be stored in the MTJ by setting the orientation of the free region. The information may be later retrieved by sensing a resistance of the MTJ stack.

BRIEF DESCRIPTION OF THE DRAWINGS

In the course of the detailed description that follows, reference will be made to the appended drawings. The drawings show different aspects of the present disclosure and, where appropriate, reference numerals illustrating like structures, components, materials and/or elements in different figures are labeled similarly. It is understood that various combinations of the structures, components, and/or elements, other than those specifically shown, are contemplated and are within the scope of the present disclosure.

Moreover, there are many embodiments of the present disclosure described and illustrated herein. The present disclosure is neither limited to any single aspect nor embodiment thereof, nor to any combinations and/or permutations of such aspects and/or embodiments. Moreover, each of the aspects of the present disclosure, and/or embodiments thereof, may be employed alone or in combination with one or more of the other aspects of the present disclosure and/or embodiments thereof. For the sake of brevity, certain permutations and combinations are not discussed and/or illustrated separately herein.

FIG. 3 depicts a simplified cross-sectional view of a portion of an exemplary SOT-MRAM device comprising one-transistor one-magnetic tunnel junction (1T1MTJ) memory cells, according to one aspect of the current disclosure.

Figure 1:
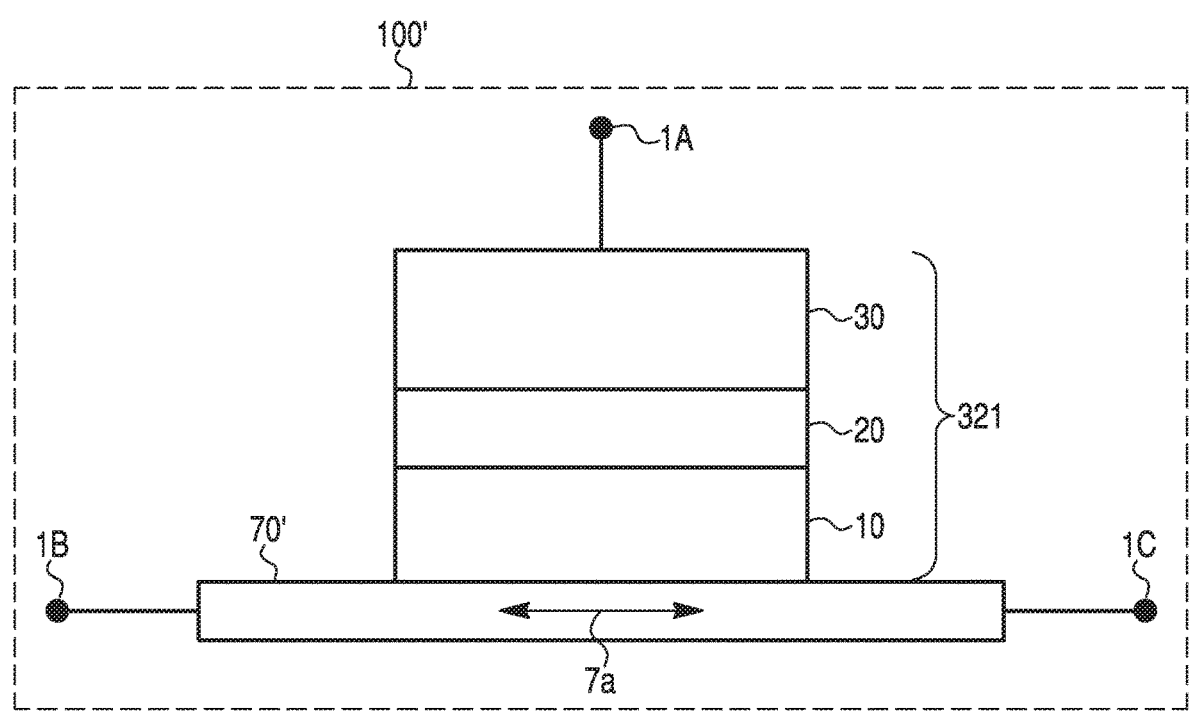
FIG. 1 depicts a three-terminal memory cell of an exemplary magnetoresistive device.

As used herein, the terms "comprises," "comprising," or any other variation thereof, are intended to cover a non-exclusive inclusion, such that a process, method, article, or apparatus that comprises a list of elements does not include only those elements, but may include other elements not expressly listed or inherent to such process, method, article, or apparatus. The term "exemplary" is used in the sense of "example," rather than "ideal."

DETAILED DESCRIPTION

Detailed illustrative aspects are disclosed herein. However, specific structural and functional details disclosed herein are merely representative for purposes of describing example embodiments of the present disclosure. The present disclosure may be embodied in many alternate forms and should not be construed as limited to only the embodiments set forth herein. Further, the terminology used herein is for the purpose of describing particular embodiments only and is not intended to be limiting of exemplary embodiments described herein.

When the specification makes reference to "one embodiment" or to "an embodiment," it is intended to mean that a particular feature, structure, characteristic, or function described in connection with the embodiment being discussed is included in at least one contemplated embodiment of the present disclosure. Thus, the appearance of the phrases, "in one embodiment" or "in an embodiment," in different places in the specification does not constitute a plurality of references to a single embodiment of the present disclosure.

As used herein, the singular forms "a," "an," and "the" are intended to include the plural forms as well, unless the context clearly indicates otherwise. It also should be noted that in some alternative implementations, the features and/or steps described may occur out of the order depicted in the figures or discussed herein. For example, two steps or figures shown in succession may instead be executed substantially concurrently or may sometimes be executed in the reverse order, depending upon the functionality/acts involved.

In the interest of conciseness, conventional techniques, structures, and principles known by those skilled in the art may not be described herein, including, for example, standard magnetoresistive random access memory (MRAM) process techniques, generation of bias voltages, fundamental principles of magnetism, and basic operational principles of memory devices.

During the course of this description, like numbers may be used to identify like elements according to the different figures that illustrate the various exemplary embodiments.

For the sake of brevity, conventional techniques related to accessing (e.g., reading or writing) memory, and other functional aspects of certain systems and subsystems (and the individual operating components thereof) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter.

The various embodiments presented herein are based on a magnetoresistive memory device architecture that includes one MTJ and one or more corresponding select devices (e.g., access transistors) for each memory cell. Such a memory device may be referred to as a 1T1MTJ memory device in the case of one select device, and 2T1MTJ memory device in the case of two select devices. In one embodiment, the memory device of the current disclosure may be implemented as a spin-orbit-torque (SOT) magnetoresistive random access memory (SOT-MRAM) device. In an SOT-MRAM device, the magnetic state, or more particularly the magnetization direction (used interchangeably herein) of the free region in an MTJ stack may be controlled (i.e., switched) by driving a current pulse through a switching line proximate (e.g., in electrical contact with) the free region. Such a switching line may be referred to as an SOT write line. The polarity of the current pulse determines the final magnetic state of the free region (e.g., parallel or antiparallel to the fixed region). Embodiments of magnetoresistive devices described herein utilize what may be referred to as an SOT write current to switch the magnetic state of the free region in an MTJ stack. The SOT write current through an SOT write line proximate (e.g., in electrical contact with, or otherwise adjacent to) the free region may result in an injection of a spin current into the free region and a spin torque acting on the free region. The spin current may be injected into the free region in a direction perpendicular to the interface between the free region and the SOT write line. The spin torque applied to the free region by the spin current may then impact the magnetic state of the free region.

In SOT-MRAM devices, the direction of the torque applied by the spin current may be dependent on the direction (or polarity) of the current flow in the SOT write line. In other words, the direction of the current flowing through the SOT write line adjacent to the free region may determine the direction of the torque that is applied to the free region. As such, the free region can be switched between two magnetically-stable states based on the torque applied by the current flowing in the proximately-positioned SOT write line in one direction or the other.

As discussed in more detail below, circuits and techniques are presented for accessing (e.g., writing to, reading from, etc.) 1T1MTJ or 2T1MTJ memory cells of the current disclosure. More specifically, circuits and techniques are presented for using i) a shared SOT write line to provide an SOT write current to a plurality of MTJs proximate to (e.g., in electrical contact with) the shared SOT write line, for example, during a write operation and ii) a diode or a transistor in each memory cell to eliminate electrical sneak paths (e.g., short circuits or current traveling through and/or along unintended pathways) during, e.g., a read operation.

With reference now to FIG. 1, there is depicted a memory cell 100' of an SOT-MRAM device. Memory cell 100' may include a magnetoresistive device, such as, e.g., MTJ 321 comprising an intermediate region 20 positioned between a free region 10 and a fixed region 30. In some embodiments, the intermediate region 20 includes a dielectric material, such as, e.g., magnesium oxide (MgO). In other embodiments, the intermediate region 20 may include any suitable non-magnetic material. However, MTJ 321 may not be limited to the configuration/structure specifically discussed herein. In other words, MTJ 321 may have any now-known or future-developed configuration/structure of a magnetoresistive stack. U.S. Pat. Nos. 8,686,484; 8,747,680; 9,023, 216; 9,136,464; and 9,419,208, and U.S. patent application Ser. No. 15/831,736 (filed Dec. 5, 2017); 62/591,945 (filed Nov. 29, 2017); 62/594,229 (filed Dec. 4, 2017); 62/580,612 (filed Nov. 2, 2017); 62/582,502 (filed Nov. 7, 2017), 62/588,158 (filed Nov. 17, 2017), and 62/653,796 (filed Apr. 6, 2018) describe exemplary magnetoresistive stacks that may be used in the exemplary embodiments of the current disclosure. These U.S. patents and applications are incorporated by reference in their entireties herein.

It should be noted that, although exemplary embodiments in the disclosure are described and/or illustrated herein in the context of MTJ stacks/structures, embodiments may also be implemented in giant magnetoresistive (GMR) stacks/structures where a conductor (e.g., copper) is disposed between two ferromagnetic regions/layers/materials. Indeed, embodiments of the present disclosure may also be employed in connection with other types of magnetoresistive stacks (and/or structures), wherein such stacks include a fixed region, a free region, an intermediate region, etc. For the sake of brevity, the discussions and illustrations will not be repeated specifically in the context of GMR or other magnetoresistive stacks/structures—but such discussions and illustrations are to be interpreted as being entirely applicable to GMR and other stacks/structures.

As shown in FIG. 1, each memory cell 100' may comprise three terminals including terminal 1A, terminal 1B, and terminal 1C, all of which may permit electrical access to the MTJ 321 by allowing for electrical connectivity to circuitry and other elements of the SOT-MRAM device. The free region 10 of the MTJ 321 may be adjacent to or in electrical contact with an SOT write line 70', which may provide an SOT write current to switch the magnetic state of the free region 10. Each end of the SOT write line 70' may be connected, through an interconnect (e.g., electrode, via, etc.) for example, to a corresponding select device (e.g., access transistor), which may in turn be connected to a corresponding source line, to allow for the SOT write current to travel through the SOT write line 70' (e.g., to perform a write operation). For instance, one end of the SOT write line 70', e.g., terminal 1B, may be connected to a source line through a select device positioned therebetween, and the opposite end of the SOT write line 70', i.e., terminal 1C, may be connected to another source line through another select device positioned therebetween. Different voltages may be applied to these source lines to generate an SOT write current 7a through the SOT write line 70' in a desired direction (e.g., from terminal 1B to terminal 1C, or from terminal 1C to terminal 1B). As alluded to above, the direction of the SOT write current may determine the direction of the magnetic state of the free region 10.

Further, terminal 1A shown above the fixed region 30 of the MTJ 321 may be connected, through an interconnect (e.g., electrode, via, etc.) for example, to a bitline, which may provide a read current (i.e., sensing signal) through the MTJ 321 to read a magnetic state of the MTJ 321 (i.e., to perform a read operation). A suitable select device also may be provided between terminal 1A and the bitline. Forming each memory cell as a three-terminal device as depicted in FIG. 1 may lead to an increased memory cell area due to the terminal access electrodes or vias coupled thereto, and any other connected device(s). For example, such a three-terminal device may require at least three electrodes or vias coupled to the terminals 1A, 1B, 1C, to allow for electrical connectivity to circuitry and other elements of the SOT-MRAM device.

To solve, alleviate, or minimize the above-described problem, in some embodiments of the current disclosure, each horizontal array of memory cells in an SOT-MRAM device may be connected to a single, shared SOT write line. For example, in some embodiments, an SOT write line may extend adjacent to multiple, horizontally-spaced MTJ's in a horizontal array of memory cells, thereby forming a shared SOT write line. Particularly, the shared SOT write line that passes through the horizontal array may be adjacent to (e.g., in electrical contact with) the free regions of all the (or multiple) MTJ's 321 in the horizontal array. The formation of the shared SOT write line may result in an SOT-MRAM device having two terminals in each memory cell (e.g., one terminal connected to a bit line, the other terminal connected to a source line), as will be described in greater detail in the following sections. The use of the shared SOT write line may thus lead to a reduced memory cell area, compared to that of the three-terminal memory cell discussed above with reference to FIG. 1. For example, the exemplary memory devices of the current disclosure may require just two electrodes or vias per memory cell, compared to three electrodes or vias required by the memory cell depicted in FIG. 1. Therefore, the contemplated embodiment may allow for an SOT-MRAM device with an increased density (i.e., more memory cells in a given area).

Figure 2A:
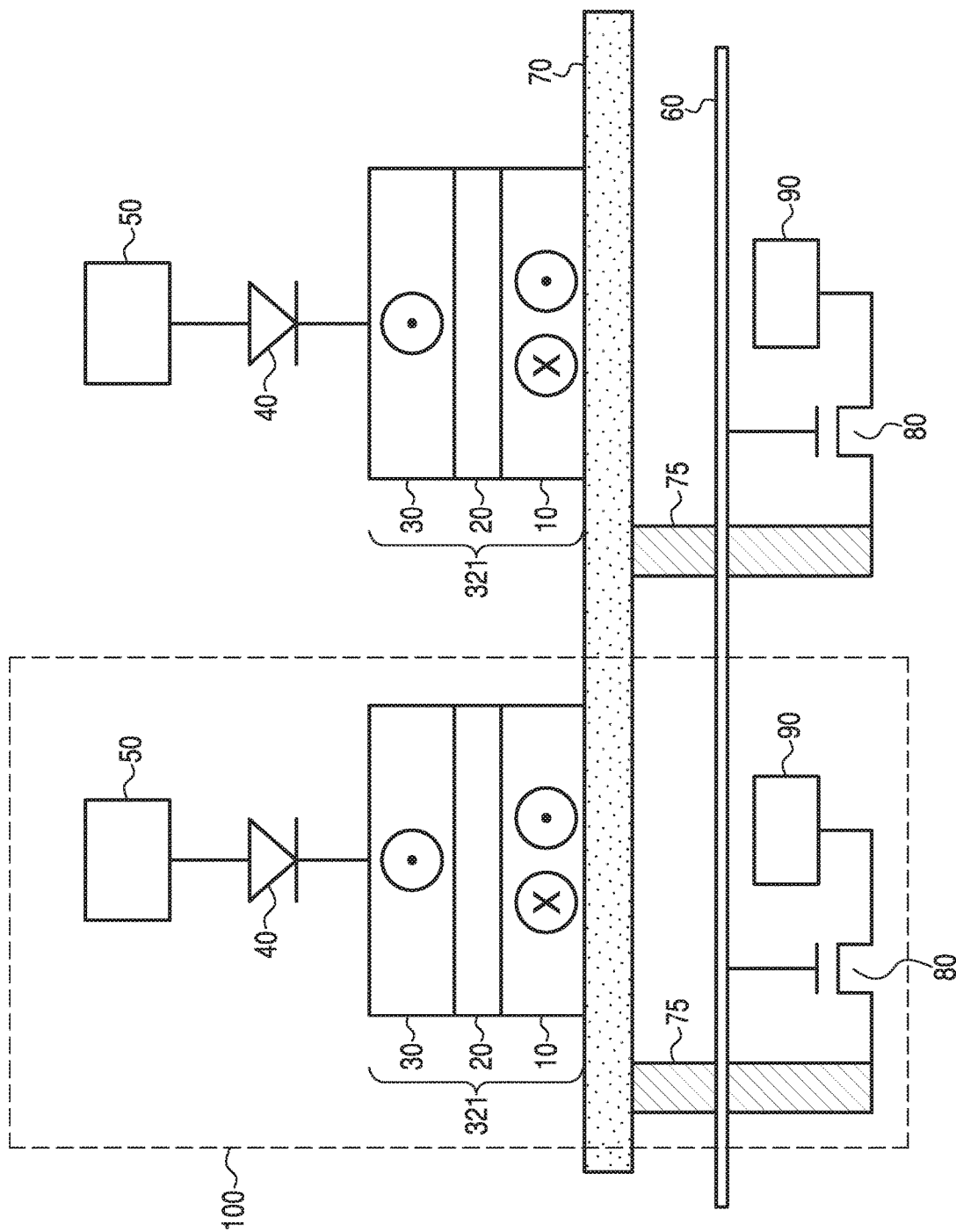
FIG. 2A depicts a simplified cross-sectional view of a portion of an exemplary SOT-MRAM device comprising one-transistor one-magnetic tunnel junction (1T1MTJ) memory cells, according to one aspect of the current disclosure.

FIG. 2A depicts a simplified cross-sectional view of a portion of an exemplary SOT-MRAM device comprising one-transistor one-magnetic tunnel junction (1T1MTJ) memory cells, according to one aspect of the current disclosure. As illustrated in FIG. 2A, each horizontal array of memory cells may includes multiple memory cells 100 spaced apart from each other horizontally. In general, each memory cell 100 may include an MTJ 321 and a select device 80 (e.g., transistor) coupled in series between a plurality of conductive lines. These conductive lines may allow different currents or voltages to be applied to the series circuit formed by the MTJ 321 and the select device 80. In the current disclosure, the lines used to apply voltages/currents to the MTJs 321 are referred to as "bit lines" and "source lines" (e.g., bit lines 50 and source lines 90), in order to promote a better understanding of the various inventions disclosed herein. These designations, however, are for purposes of discussion only, and do not serve as limiters of functionality. As will be recognized by those of ordinary skill in the art, various contemplated signal lines may connect to the MTJs 321 and respective select devices 80 via any suitable electrical connection, including, but not limited to, electrodes, vias, etc.

With continuing reference to FIG. 2A, the free regions 10 of all the MTJs 321 in the horizontal array of memory cells may be positioned adjacent to, or in electrical contact with a shared SOT write line 70. In such embodiments, the shared SOT write line 70 may carry an SOT write current to switch the magnetization direction of one or more free regions 10 of target MTJs 321 in the horizontal array (e.g., a write operation). The SOT write current may be generated and driven through desired portion(s) of the SOT write line 70 (e.g., the portion(s) of the SOT write line 70 adjacent to the target MTJ(s)) by i) driving a current through a word line 60 corresponding to the horizontal array including the target MTJ(s) and ii) controlling voltages applied to two or more source lines 90. The manner in which the SOT write current may be generated to target certain MTJ(s) will be described in greater detail below with reference to, e.g., FIGS. 6A-6B. Depending on the direction (or polarity) of the SOT write current, the resultant magnetic state of the free region 10 will be in either the first state or the second state (which is opposite to the first state).

In the exemplary embodiment shown in FIG. 2A, the magnetization direction of the fixed region 30 points out of the page (as indicated by a dot enclosed in a circle), while the magnetization direction of the free region 10, which can be switched by an SOT write current, points either into the page or out of the page (as indicated by an X or a dot enclosed in a circle, respectively). The magnetization directions of the regions 30 and 10 are thus parallel to the shared SOT write line plane and orthogonal to the direction of the current flow (e.g., SOT write current) in the shared SOT write line 70. This configuration may lead to a more deterministic switching of the free regions 10 during, for example, a write operation. In other words, the likelihood of the free regions 10 fully (or substantially fully) switching due to the SOT write current provided through the shared SOT write line 70 may be high. In other embodiments, as indicated by the arrows in FIG. 3, the same memory cell architecture illustrated in FIG. 2A may be used but with the magnetization directions of the regions 30 and 10 being parallel to the shared SOT write line plane as well as to the direction of the current flow in the shared SOT write line 70. This configuration may lead to a relatively non-deterministic (or relatively less deterministic) switching of the free regions 10 (i.e., high-speed switching but significant parts of the free regions 10 failing to switch), compared to the configuration illustrated in FIG. 2A. In some such embodiments, the configurations likely to experience non-deterministic switching may be assisted with an external magnetic field provided by an external magnet or a conductor, so that the magnetization direction of the free regions 10 may be more fully and completely switched. Nevertheless, the shared SOT write line 70 of the current disclosure may be used in either of the configurations discussed above.

Continuing with FIG. 2A, fixed region 30 of each MTJ 321 in the horizontal array may be connected, through an interconnect (e.g., electrode, via, etc.) or not, to a bit line 50, from which a read current (i.e., sensing signal) may be provided to read a magnetic state of the MTJ 321. In the exemplary embodiment illustrated in FIG. 2A, diode 40 may also be connected between the fixed region 30 and the bit line 50. A read operation may be accomplished by driving a read current from bit line 50 though the MTJ 321, to read a magnetic state of the MTJ 321. For example, the resistance across the MTJ 321 may be detected by applying a voltage at the bit line 50 while pulling the source line 90 to a lower voltage (e.g., ground), then determining the resistance based on the resultant current across the MTJ 321. In other embodiments, a matched current source may be used to apply a known current through the MTJ 321, then the resistance may be determined based on the voltage drop across the MTJ 321. Notably, diode 40 may be positioned between the fixed region 30 and the bit line 50 to prevent current leakage (e.g., short circuits or current traveling through and/or along unintended pathways), which may degrade the read current strength. As will be further described in the following sections, other types of devices, such as, e.g., a transistor, may be positioned between the fixed region 30 and bit line 50 instead of the diode 40, to achieve the same effect (i.e., prevent current leakage).

Figure 2B:
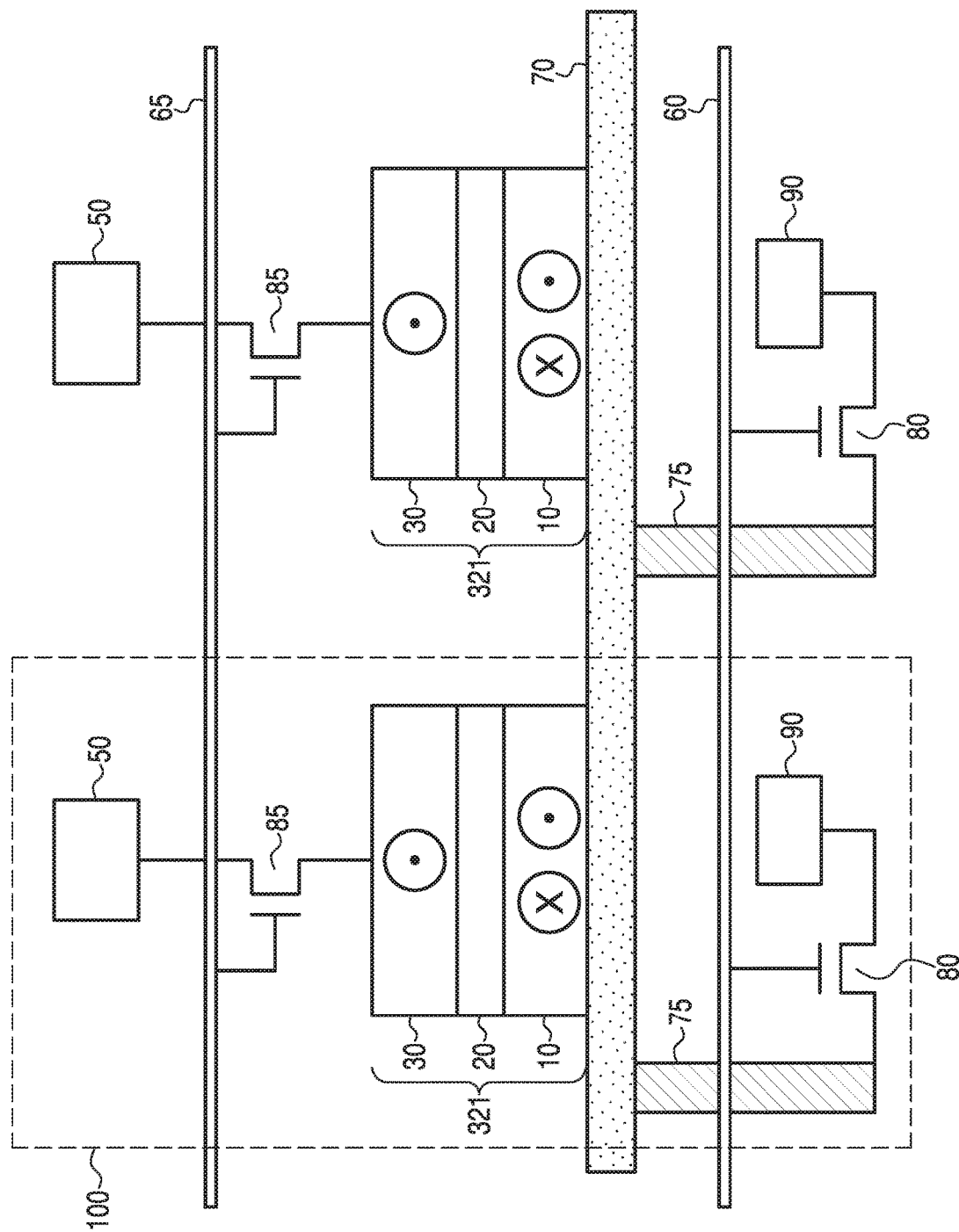
FIG. 2B depicts a simplified cross-sectional view of a portion of an exemplary SOT-MRAM device comprising two-transistor one-magnetic tunnel junction (2T1MTJ) memory cells, according to one aspect of the current disclosure.
Figure 2C:
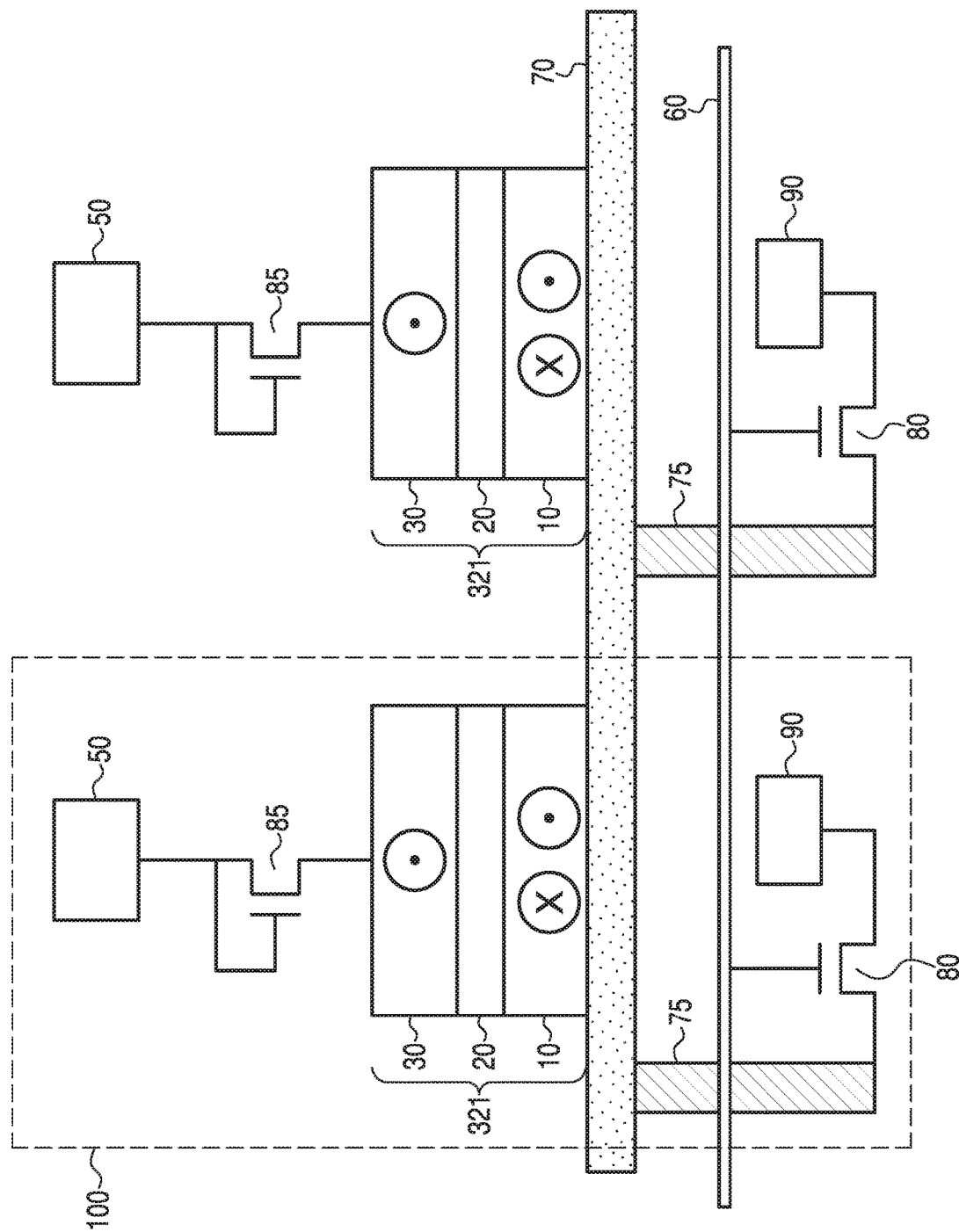
FIG. 2C depicts a simplified cross-sectional view of a portion of an exemplary SOT-MRAM device comprising two-transistor one-magnetic tunnel junction (2T1MTJ) memory cells, according to one aspect of the current disclosure.

FIG. 2B depicts a simplified cross-sectional view of a portion of an exemplary SOT-MRAM device including two-transistor one-magnetic tunnel junction (2T1MTJ) memory cells, according to one aspect of the current disclosure. FIG. 2B depicts an embodiment alternative to the exemplary embodiment illustrated in FIG. 2A. Notably, instead of diode 40 positioned between the MTJ 321 and the bit line 50 as illustrated in FIG. 2A, each memory cell 100 in FIG. 2B includes a transistor 85 between the MTJ 321 and the bit line 50, and a read word line 65 connected to the gates of all the transistors 85 in the horizontal array. Similar to the diodes 40 in FIG. 2A, the transistors 85 in FIG. 2B may prevent or may aid in preventing current leakage by blocking any backflow of current toward the bit lines 50 during, for example, a write operation. During a write operation, read word line 65 may be set to ground to "turn off" the transistors 85. During a read operation, for instance, a transistor 85 that is "turned on" by applying a positive voltage at the read word line 65 may allow a read current originating from bit line 50 to travel in one direction, from the source to the drain of the transistor 85 (e.g., from bit line 50 towards MTJ 321). Further, voltages applied to bit lines 50 (i.e., voltage levels of the bit lines 50) may be adjusted in order to control current flow through the transistors 85. In some embodiments, the read word line 65 may be removed, and the gate and the source of each transistor 85 may both be connected to the bit line 50 as depicted in FIG. 2C. The transistor 85 implemented in the manner illustrated in FIG. 2C will also have the effect of preventing current leakage toward the bit lines 50 by adjusting the voltages applied to the bit lines 50 (i.e., the voltage levels of the bit lines 50).

It should be noted that although FIGS. 2A-2C and FIG. 3 each illustrate just two neighboring memory cells 100 in a horizontal array, this is only for the sake of simplicity and clarity. As would be known to a person of ordinary skill in the art, any number of memory cells 100 may be included in a horizontal array. Further, the resultant SOT-MRAM device may include any number of such horizontal arrays arranged in rows.

Figure 4:
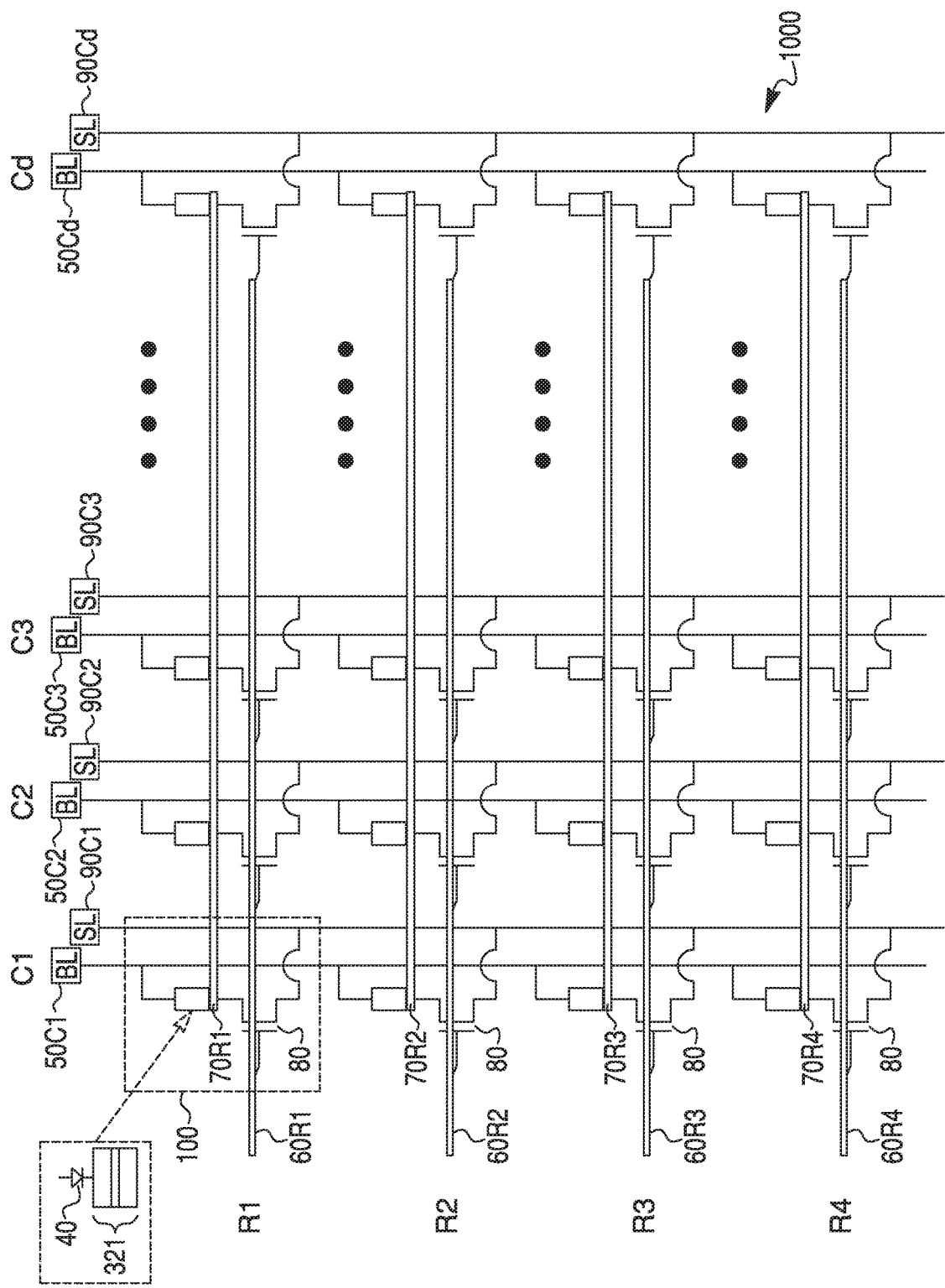
FIG. 4 depicts a schematic diagram of a portion of an exemplary SOT-MRAM device comprising a plurality of 1T1MTJ memory cells illustrated in FIG. 2A, according to one aspect of the current disclosure.

FIG. 4 depicts a schematic diagram of a portion of an exemplary SOT-MRAM device 1000 comprising a plurality of 1T1MTJ memory cells 100 illustrated in FIG. 2A. In general, MTJ 321 (along with diode 40 coupled to fixed region 30 thereof) and select device 80 of each memory cell 100 are coupled between a corresponding bit line (e.g., bit lines 50C1, 50C2, 50C3, 50Cd, etc.) and a corresponding source line (e.g., source lines 90C1, 90C2, 90C3, 90Cd, etc.). More particularly, the gate, source, and drain of each select device 80 are coupled to a corresponding word line, source line, and shared SOT write line, respectively. By controlling voltages at the bit lines, source lines, and word lines, each MTJ 321 in device 1000 can be individually selected for various operations (e.g., read, write, differential bit write, set/reset, etc.). For example, a read/write circuit (not shown in FIG. 4) comprising i) drivers to selectively drive the bit lines and the source lines and ii) a read circuitry to determine the states of the MTJs and resulting data bits stored in the memory cells may be connected to the bit lines and the source lines. Further, a word line driver (not shown in FIG. 4) may be connected to the word lines to selectively provide word line voltages to the word lines. During a stand-by mode in which the states of the MTJs 321 are retained, the bit lines, source lines, and word lines may all be set to ground to eliminate current flow in and among the memory cells 100.

In FIG. 4, there is illustrated a total of four horizontal arrays of memory cells arranged in four rows, where the position of each memory cell in a horizontal array may be indicated by the corresponding row and column numbers (e.g., R1, R2, R3, R4 and C1, C2, C3, Cd). In the following sections, each memory cell (or any component therein, such as, e.g., MTJ, diode, and select device) may be identified by its corresponding row and column numbers. For example, the memory cell located at the leftmost section of the top horizontal array will be designated as memory cell 100 at R1/C1. Similarly, the MTJ within that memory cell will be designated as MTJ 100 at R1/C1. The diode and the select device within that memory cell will follow the same convention (e.g., diode 40 at R1/C1, select device 80 at R1/C1). The row or column numbers will also be appended to the designations of the signal lines, such as, e.g., bit lines 50, source lines 90, SOT write lines 70, and word lines 60. For example, the SOT write line and the word line passing through the horizontal array of memory cells at R1 may be designated as SOT write line 70R1 and word line 60R1, respectively. Similarly, the bit line and the source line providing voltages across (or driving currents through) the memory cells in C1 will be designated as bit line 50C1 and source line 90C1, respectively.

It should also be noted that the memory cells located at the rightmost column (i.e., dummy column), Cd, will be referred to as "dummy" memory cells. The bit line and the source line connected to the "dummy" memory cells along Cd will be referred to as bit line 50Cd and source line 90Cd, respectively. The dummy column Cd and the memory cells therein may be implemented in order to provide currents through the portions of the shared SOT write lines that are positioned along the column immediately adjacent to (i.e., left of) the dummy column Cd, so that the magnetic states of the MTJs in that column can also be switched. The MTJs along the dummy column Cd may not be operable (e.g., unable to be switched or otherwise not used for data storage) as it may not be possible to provide a sufficient amount of current through the portions of the shared SOT write lines adjacent to these MTJs. As alluded to above, while only four horizontal arrays are shown in FIG. 4, any number of horizontal arrays may exist in the illustrated portion of the SOT-MRAM device 1000. Further, as suggested by the dotted lines between the memory cells located along C3 and Cd, the number of memory cells in each horizontal array may not be limited to four and any number of memory cells may exist in each horizontal array.

Figure 5:
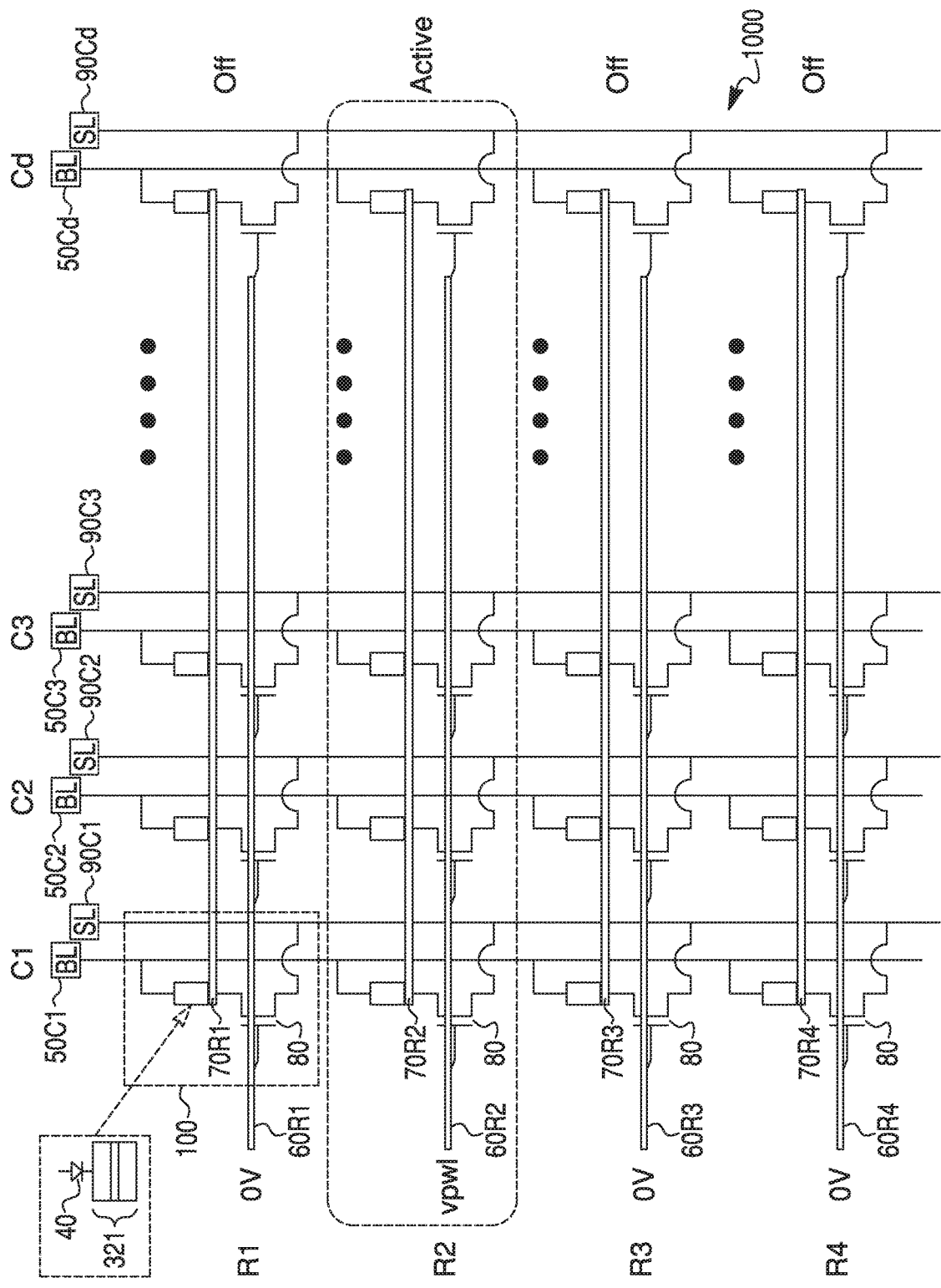
FIG. 5 depicts a schematic diagram of a portion of an exemplary SOT-MRAM device comprising a plurality of 1T1MTJ memory cells illustrated in FIG. 2A after a horizontal array of memory cells is activated, according to one aspect of the current disclosure.
Figure 6A:
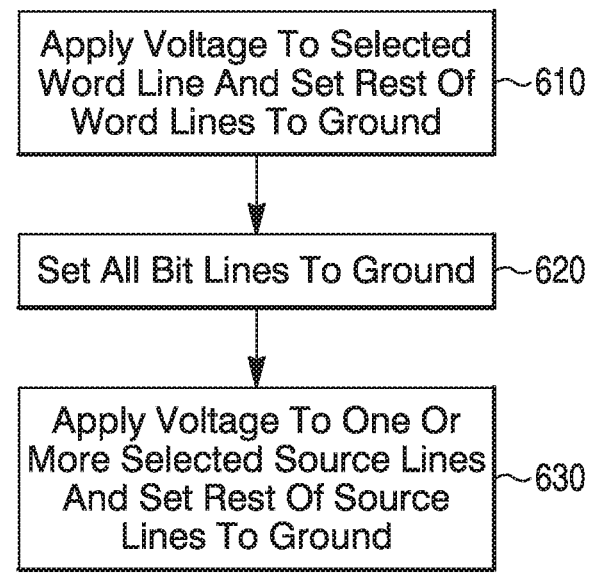
FIG. 6A is a flowchart illustrating an exemplary method of selecting and writing to an MTJ of an exemplary SOT-MRAM device, according to one aspect of the current disclosure.
Figure 7A:
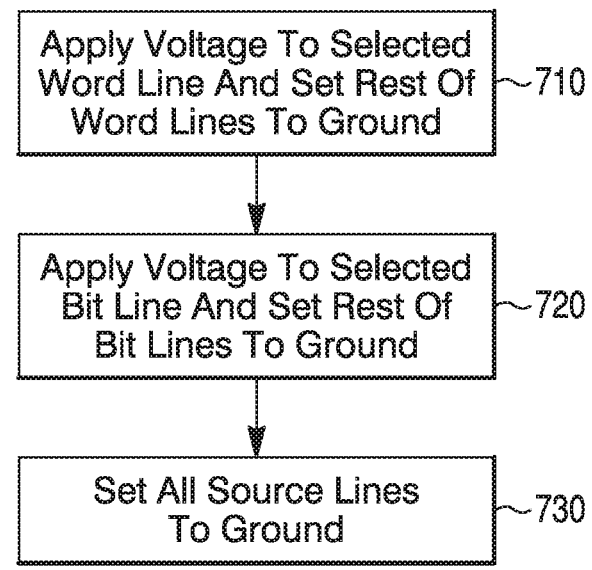
FIG. 7A is a flowchart illustrating an exemplary method of selecting and reading a magnetic state of an MTJ of an exemplary SOT-MRAM device, according to one aspect of the current disclosure.
Figure 7B:
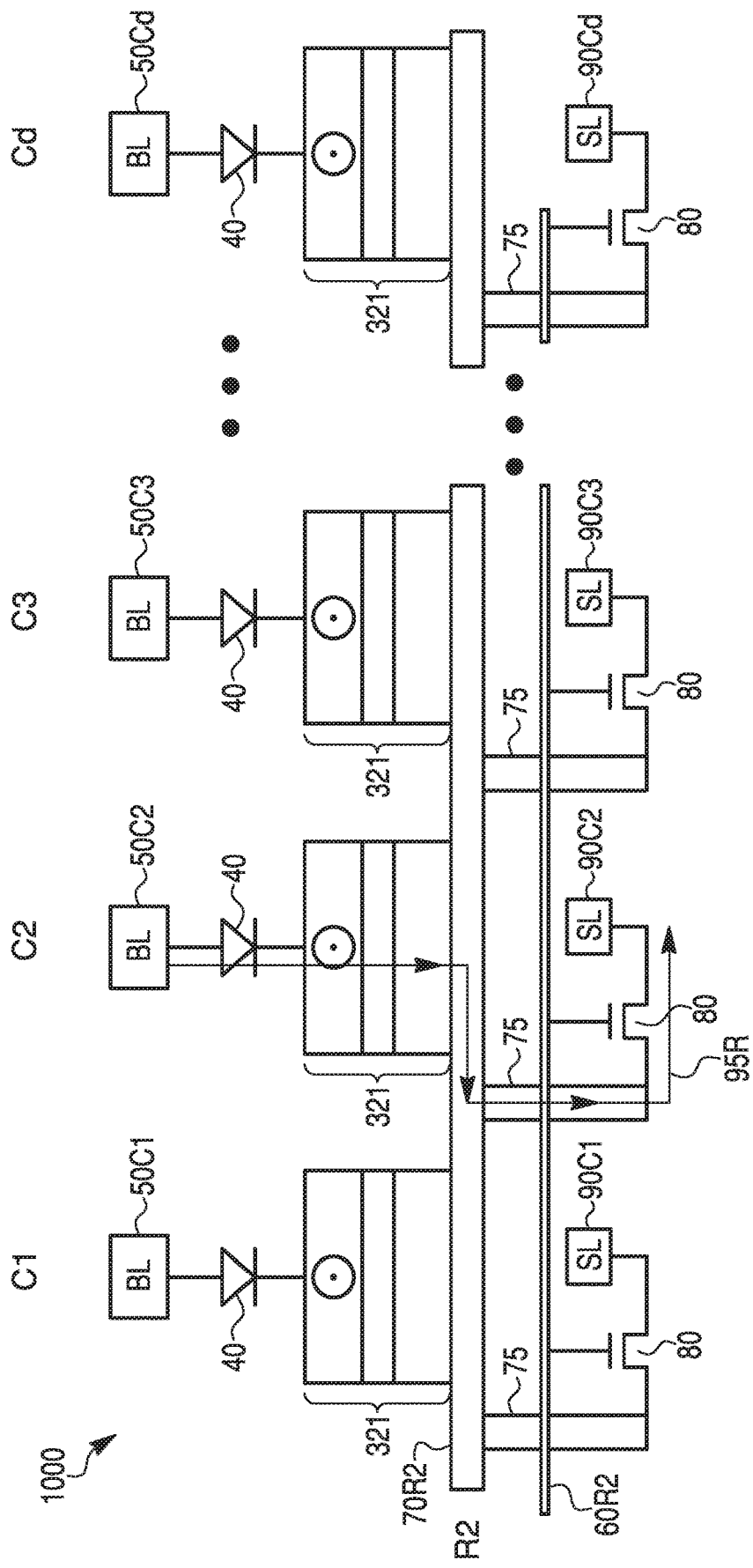
FIG. 7B depicts a simplified cross-sectional view of an active horizontal array during the read operation illustrated in FIG. 7A, according to one aspect of the current disclosure.
Figure 8A:
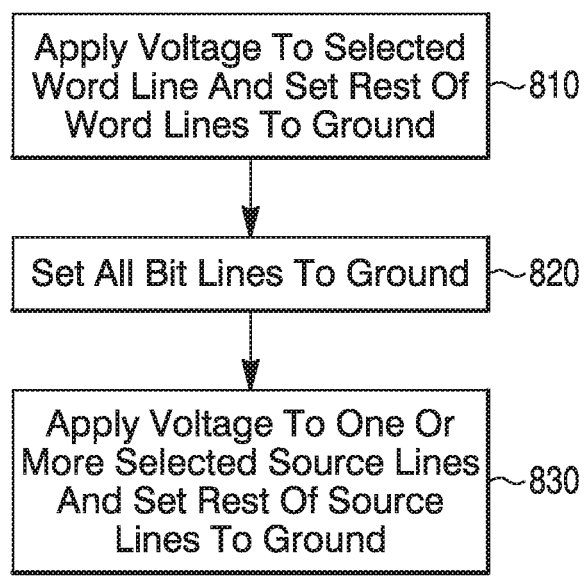
FIG. 8A is a flowchart illustrating an exemplary method of writing a differential bit using a pair of neighboring MTJs of an exemplary SOT-MRAM device, according to one aspect of the current disclosure.
Figure 8B:
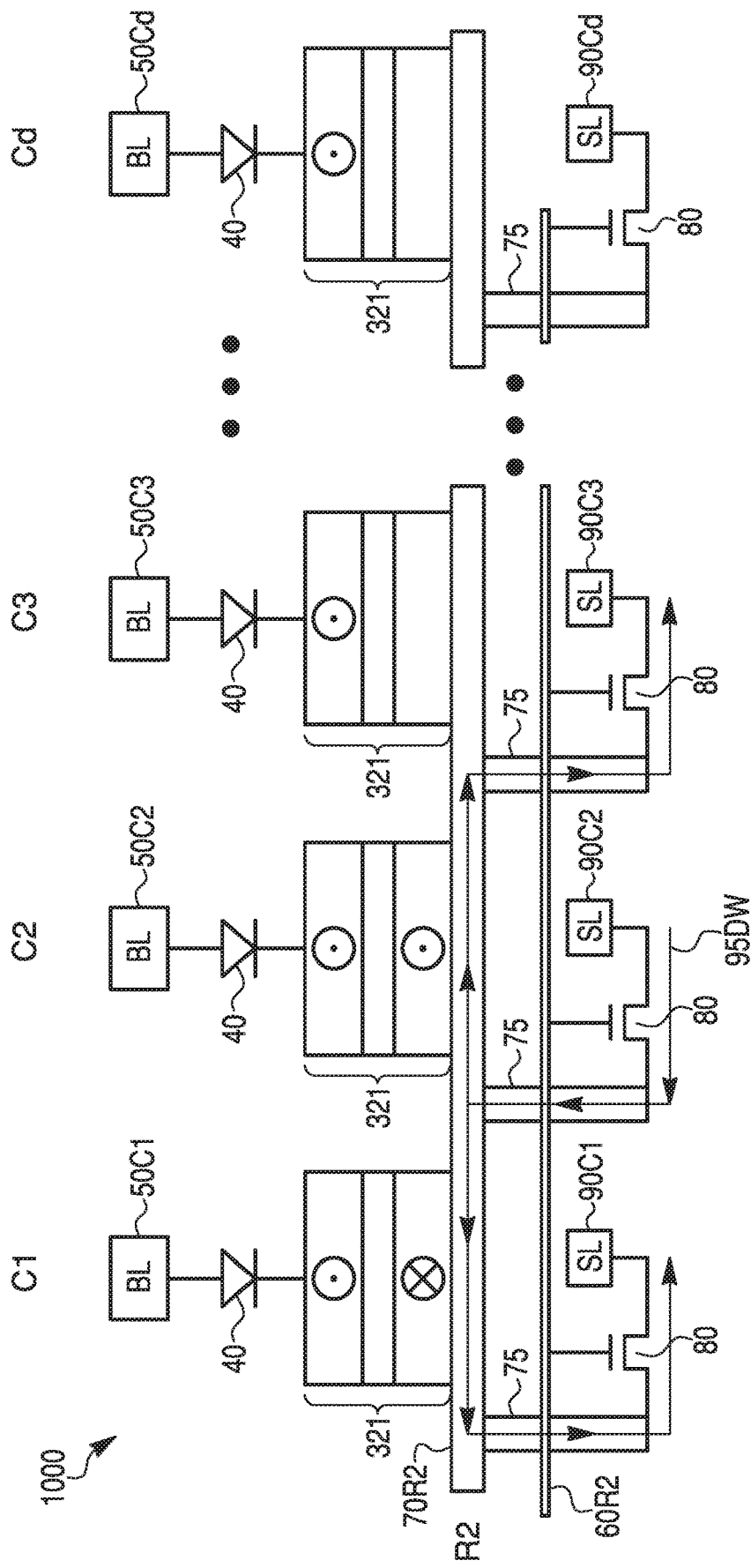
FIG. 8B depicts a simplified cross-sectional view of an active horizontal array during the differential bit write operation illustrated in FIG. 8A, according to one aspect of the current disclosure.
Figure 9A:
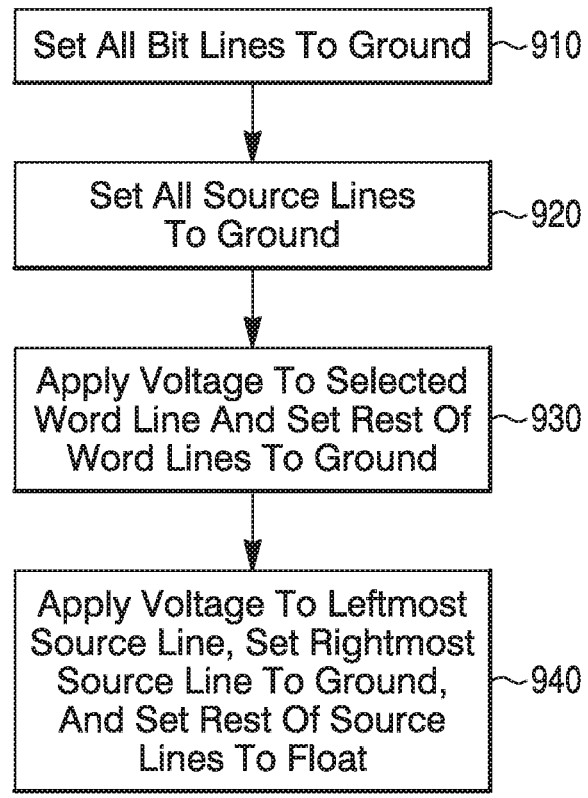
FIG. 9A is a flowchart illustrating an exemplary method of selecting and resetting a horizontal array of memory cells of an exemplary SOT-MRAM device, according to one aspect of the current disclosure.
Figure 9B:
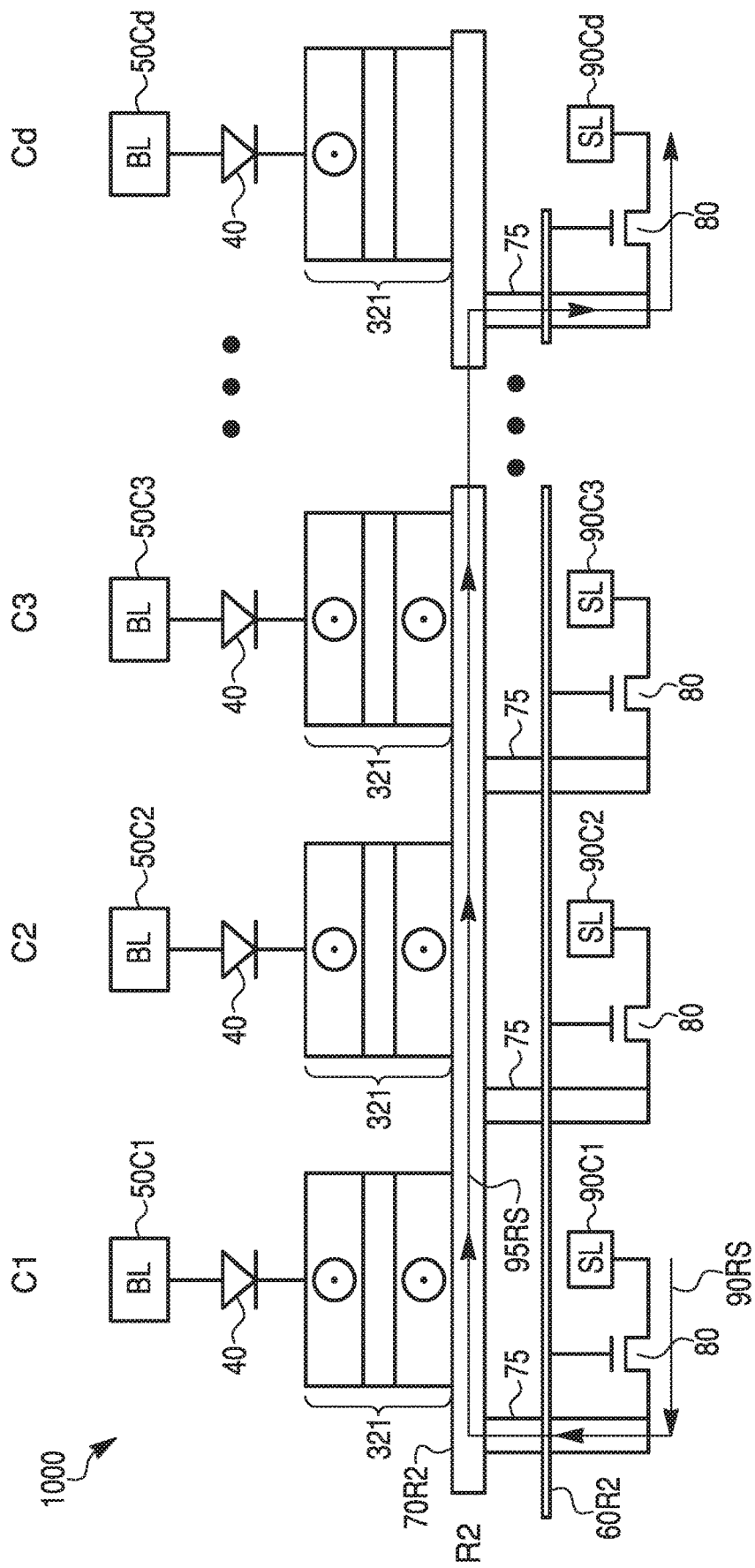
FIG. 9B depicts a simplified cross-sectional view of an active horizontal array during the reset operation illustrated in FIG. 9A, according to one aspect of the current disclosure.

Now with reference to FIG. 5 and FIGS. 6A-9B, exemplary methods of selectively accessing an MTJ 321 of SOT-MRAM device 1000 to perform various operations (e.g., write, read, differential bit write, and set/reset) will be illustrated. More particularly, FIGS. 6A-6B will illustrate an exemplary method of selecting and writing to the MTJ 321 at R2/C2 (i.e., target MTJ 321). FIGS. 7A-7B will illustrate an exemplary method of selecting and reading from the target MTJ. FIGS. 8A-8B will illustrate an exemplary method of writing a differential bit using a pair of neighboring MTJs at R2/C1 and R2/C2 (i.e., a pair of target MTJs 321). FIGS. 9A-9B will illustrate an exemplary method of setting/resetting a horizontal array of memory cells at R2. It should be noted that, although FIGS. 6A, 7A, and 8A show MTJs 321 that are selected at certain positions in the memory arrays (e.g., at R2/C2 and R1/C1), this is merely exemplary and it would be obvious to a person of ordinary skill in the art that any one or more MTJs 321 in the memory arrays may be selected using the exemplary methods discussed with reference to FIGS. 6B, 7B, and 8B.

FIG. 5 depicts a schematic diagram of a portion of an exemplary SOT-MRAM device 1000, with the horizontal array of memory cells at R2 activated (i.e., selected). As will be explained in greater detail in the following sections, a suitable word line voltage (i.e., vpw1) may be applied to word line 60R2 to activate/select the horizontal array of memory cells at R2, and to subsequently access any of the MTJs 321 located along the activated horizontal array by controlling the voltages applied to the bit lines and the source lines (to perform any of the operations described below with reference to FIGS. 6A-9B).

Figure 6B:
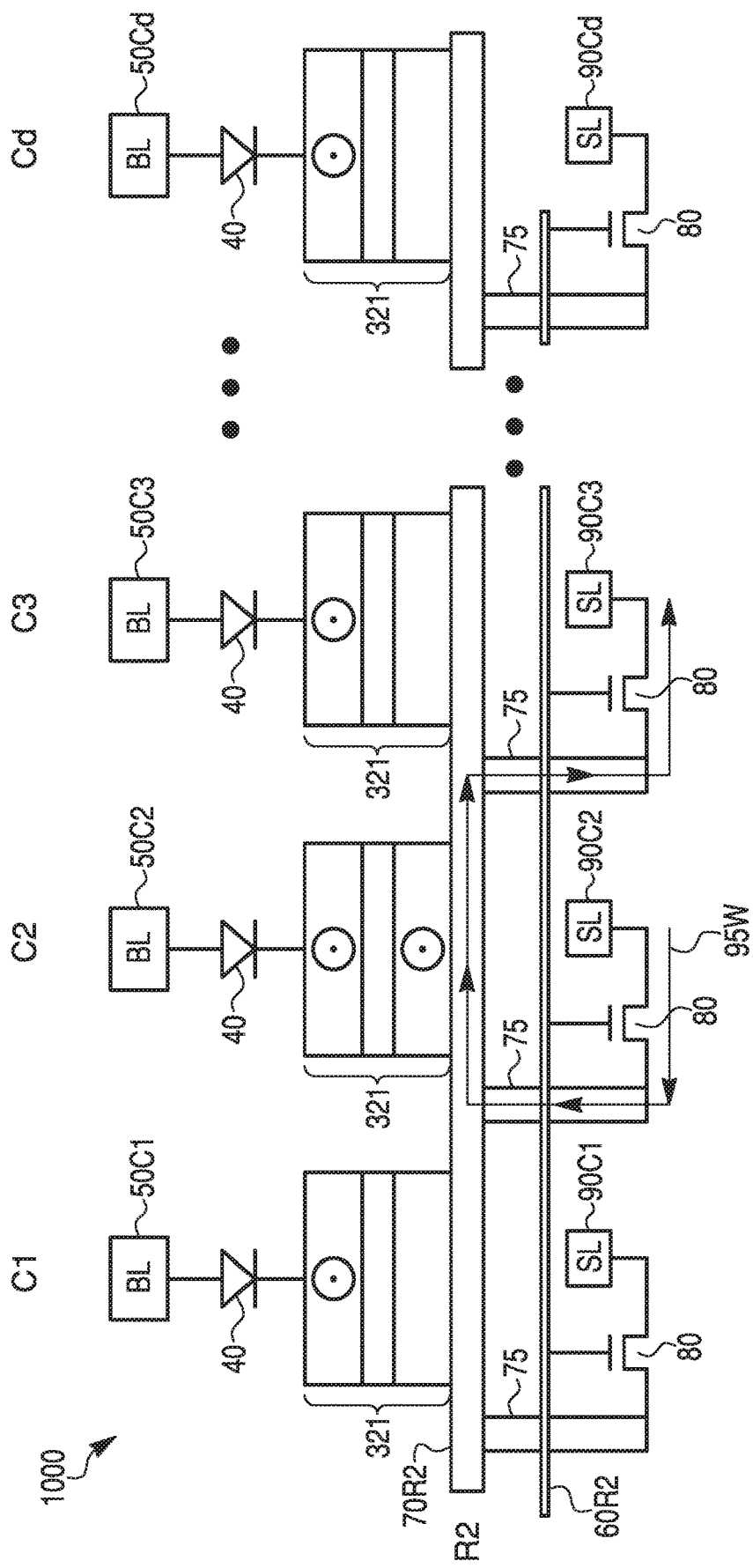
FIG. 6B depicts a simplified cross-sectional view of an active horizontal array during the write operation illustrated in FIG. 6A, according to one aspect of the current disclosure.

FIG. 6A is a flowchart illustrating an exemplary method 600 of selecting and writing to (i.e., storing a data bit in) an MTJ 321 (at R2/C2) of an exemplary SOT-MRAM device 1000. FIG. 6B depicts a simplified cross-sectional view of an active horizontal array comprising the target MTJ 321, during the write operation illustrated in FIG. 6A. In the discussion below, reference will be made to both FIG. 6A and FIG. 6B. At step 610 of the exemplary method 600 in FIG. 6A, a suitable word line voltage may be applied to word line 60R2 to activate the horizontal array at R2, and the rest of the word lines (e.g., word lines 60R1, 60R3, 60R4 in FIG. 5) may be set to ground. For example, word line 60R2 may be driven to a word line voltage suitable for a write operation, while the other word lines (e.g., word lines 60R1, 60R3, 60R4) may be maintained at a low voltage supply (VSS), which, in some aspects, may be ground. By driving only word line 60R2 to a word line voltage, the select devices 80 connected to word line 60R2 may be "turned on" (i.e., pass current from source to drain), while the select devices 80 connected to other word lines (e.g., word lines 60R1, 60R3, 60R4) may be "turned off" (i.e., block passage of current). For example, FIG. 5 shows the active horizontal array of memory cells at R2. Once the horizontal array at R2 has been activated, at step 620, all bit lines (e.g., bit line 50C1, bit line 50C2, bit line 50C3, bit line 50Cd, etc.) may be set to ground. Then, at step 630, a source line voltage suitable for a write operation may be applied to one or more source lines and the rest of the source lines may be set to ground, to generate an SOT write current through a portion of the shared SOT write line 70R2 adjacent to the target MTJ 321 (i.e., MTJ 321 at R2/C2).

Selection of the source lines to which the source line voltage is applied may determine the location as well as the direction of the SOT write current generated along the shared SOT write line 70R2. The direction of the SOT write current may then decide the magnetization direction of the free region 10 of the target MTJ 321. For example, as shown in FIG. 6B, to have the magnetization direction of the free region 10 of the target MTJ 321 pointing out of the page (e.g., parallel to the magnetization direction of the fixed region 30 of the target MTJ 321), source lines 90C1 and 90C2 may be driven to a source line voltage suitable for a write operation, and the rest of the source lines (e.g., source line 90C3, source line 90Cd, etc.) in the array may be set to ground. Due to the voltage potential difference created between the source line 90C2 and the source line 90C3, SOT write current 95W may be generated as illustrated in FIG. 6B, flowing from the source line 90C2 toward the source line 90C3, through the portion of the shared SOT write line 70R2 adjacent to the target MTJ 321.

Conversely, to have the magnetization direction of the free region 10 of the target MTJ 321 pointing into the page (e.g., antiparallel to the magnetization direction of the fixed region 30 of the target MTJ 321), sources lines 90C3 and 90Cd (and any source lines therebetween) may be driven to a source line voltage suitable for a write operation, and the rest of the source lines (e.g., source lines 90C1 and 90C2) may be set to ground. Due to the voltage potential difference created between the source line 90C3 and the source line 90C2, an SOT write current may be generated flowing from the source line 90C3 toward the source line 90C2, through the portion of the shared SOT write line 70R2 adjacent to the target MTJ 321.

It should also be noted that diodes 40 positioned between the MTJs 321 and the bit lines 50 may prevent current leakage toward the bit lines 50 during the write operation. Further, in some embodiments, step 610 (i.e., word line selection) may be performed during or after step 630 (i.e., source line selection).

FIG. 7A is a flowchart illustrating an exemplary method 700 of selecting and reading a magnetic state of an MTJ 321 (at R2/C2) of an exemplary SOT-MRAM device 1000. FIG. 7B depicts a simplified cross-sectional view of an active horizontal array comprising the target MTJ 321, during the read operation illustrated in FIG. 7A. In the discussion below, reference will be made to both FIG. 7A and FIG. 7B. At step 710 of the exemplary method 700 in FIG. 7A, a suitable word line voltage may be applied to word line 60R2 to activate the horizontal array at R2, and the rest of the word lines (e.g., word lines 60R1, 60R3, and 60R4 in FIG. 5) may be set to ground, as discussed above with reference to step 610 in FIG. 6A. For example, FIG. 5 shows the activated/selected horizontal array of memory cells at R2. Once the horizontal array at R2 has been activated, at step 720, a bit line voltage suitable for a read operation may be applied to bit line 50C2, and the rest of the bit lines (e.g., bit line 50C1, bit line 50C3, bit line 50Cd, etc.) may be set to ground. Then, at step 730, all of the source lines (e.g., source line 90C1, source line 90C2, source line 90C3, source line 90Cd, etc.) may be set to ground. Due to the voltage potential difference created between the bit line 50C2 and the source lines 90C1, 90C2, 90C3, 90Cd, etc., read current 95R may be generated as illustrated in FIG. 7B, flowing from the bit line 50C2, through the target MTJ 321, then toward the source line 90C2 by way of the shared SOT write line 70R2 at R2/C2. While most of the read current 95R may take the shorter path and flow toward the source line 90C2, a small amount of the read current 95R may also flow toward the source lines 90C1 and C3 through the shared SOT write line 70R2, which may be negligible and may not impact the read operation or otherwise cause any unwanted write type operations. The resistive state (e.g., high or low resistance) of the target MTJ 321 may then be determined based on, for example, the read current 95R across the target MTJ 321.

Because the bit lines 50C1, 50C3, 50Cd, etc. (i.e., the bit lines other than the bit line 50C2) are set to ground, a small amount of read current 95R may also travel toward these bit lines, creating a sneak path. Diodes 40 positioned between the MTJs 321 and the bit lines of columns C1, C3, Cd may eliminate such sneak paths to maintain the strength of the read current. As discussed above with reference to FIGS. 2B-2C, in some embodiments, transistors may be used instead of the diodes 40 to prevent the read current 95R from traveling toward the bit lines. Further, in some embodiments, the voltage applied to the bit line 50C2 (in step 720) may be controlled such that the resultant read current 95R flowing in the shared SOT writing line 70R2 at R2/C2 is sufficiently low, so that the magnetization direction of the free region 10 of the target MTJ 321 may not be affected.

In an alternative embodiment, diodes 40 in FIG. 7B may be removed, and the MTJs 321 (or the fixed regions 30 thereof) may be directly coupled to the bit lines 50. As alluded to above, the removal of the diodes 40 may cause the read current to travel toward the grounded bit lines 50C1, 50C3, 50Cd, etc. (i.e., the bit lines other than the bit line 50C2), which may substantially degrade the read current strength. To mitigate or avoid this problem, at step 720, the bit lines 50C1, 50C3, 50Cd, etc. may be driven to the same voltage as the bit line 50C2, eliminating the voltage potential difference between the bit line 50C2 and the rest of the bit lines. In other words, the same voltage may be applied across the bit lines 50C1, 50C2, 50C3, 50Cd, etc., so that no current would flow between these bit lines.

FIG. 8A is a flowchart illustrating an exemplary method of writing a differential bit using a pair of neighboring MTJs 321 (at R2/C1 and R2/C2) of an exemplary SOT-MRAM device 1000. FIG. 8B depicts a simplified cross-sectional view of an active horizontal array comprising the pair of target MTJs 321, during the differential bit write operation illustrated in FIG. 8A. In the discussion below, reference will be made to both FIG. 8A and FIG. 8B.

Because the resistance through different MTJs can vary significantly reducing achievable read signal, two neighboring MTJs in a memory may be written to complementary states to store a single bit of information. The stored bit can be readily determined by comparing the states of the two complementary MTJs. This can be more reliable and faster than comparing the resistance of a single MTJ with a reference. In one example of a pair of MTJs storing a bit having the value "0," the first MTJ may be in a first state (e.g., a relatively lower resistance), and the second MTJ may be in a second state (e.g., a relatively higher resistance). If the first MTJ is in the second state (e.g., a relatively higher resistance) and the second MTJ is in the first state (e.g., a relatively lower resistance), that can represent the value "1."

Therefore, writing a differential bit using a pair of neighboring MTJs may require two opposite write currents to be passed adjacent the two neighboring MTJs in order to store the two different states in those MTJs. The flow chart in FIG. 8A describes an exemplary method 800 of generating such two opposite SOT write currents adjacent a pair of neighboring MTJs at R2/C1 and R2/C2 of device 1000. At step 810, a suitable word line voltage may be applied to word line 60R2 to activate the horizontal array at R2, and the rest of the word lines (e.g., word lines 60R1, 60R3, 60R4 in FIG. 5) may be set to ground, as discussed above with reference to step 610 in FIG. 6A. For example, FIG. 5 shows the activated/selected horizontal array of memory cells at R2. Once the horizontal array at R2 has been activated, at step 820, all of the bit lines (bit line 50C1, bit line 50C2, bit line 50C3, bit line 50Cd, etc.) may be set to ground. Then, at step 830, a source line voltage suitable for a write operation may be applied to one or more source lines and the rest of the source lines may be set to ground, to generate two opposite SOT write currents through the portions of the shared SOT writing line 70R2 adjacent the pair of target MTJs 321 (i.e., MTJs at R2/C1 and R2/C2).

For example, as shown in FIG. 8B, to have the magnetization direction of the free region 10 of the MTJ 321 at R1/C1 pointing into the page (e.g., antiparallel to the magnetization direction of the fixed region 30 of the MTJ 321 at R1/C1, resulting in a relatively higher resistance) and the magnetization direction of the free region 10 of the MTJ 321 at R2/C2 pointing out of the page (e.g., parallel to the magnetization direction of the fixed region 30 of the MTJ 321 at R2/C2, resulting in a relatively lower resistance), source line 90C2 may be driven to a source line voltage suitable for a write operation, and the rest of the source lines (e.g., source line 90C1, source line 90C3, source line 90Cd, etc.) in the horizontal array may be set to ground. Due to the voltage potential different created between the source line 90C2 and the source line 90C1, and between the source line 90C2 and the source line 90C3, an SOT write current 95DW may be generated as illustrated in FIG. 8B, flowing from the source line 90C2, then being split into two SOT write currents in opposite directions along the shared SOT write line 70R2. For example, one SOT write current 95DW may travel adjacent the MTJ 321 at R2/C1 toward the source line 90C1, and the other SOT write current 95DW may travel adjacent the MTJ 321 at R2/C2 toward the source line 90C3.

Conversely, to have the magnetization direction of the free region 10 of the MTJ 321 at R1/C1 pointing out of the page (e.g., parallel to the magnetization direction of the fixed region 30 of the MTJ 321 at R1/C1, resulting in a relatively lower resistance) and the magnetization direction of the free region 10 of the MTJ 321 at R2/C2 pointing into the page (e.g., antiparallel to the magnetization direction of the fixed region 30 of the MTJ 321 at R2/C2, resulting in a relatively higher resistance), all of the source lines except the source line 90C2 (e.g., source line 90C1, source line 90C3, source line 90Cd, etc.) may be driven to a suitable source line voltage, and the source line 90C2 may be set to ground. Due to the voltage potential difference created between the source line 90C1 and the source line 90C2, and between the source line 90C3 and the source line 90C2, two SOT write currents may be generated traveling from the source line 90C1 and the source line 90C3, respectively, toward each other. Particularly, one SOT write current may travel from the source line 90C1 toward the source line 90C2 through the shared SOT write line 70R2 adjacent the MTJ 321 at R2/C1, and the other SOT write current may travel from the source line 90C3 to the source line 90C2 through the shared SOT write line 70R2 adjacent the MTJ 321 at R2/C2.

FIG. 9A is a flowchart illustrating an exemplary method of selecting and setting/resetting a horizontal array of memory cells (at R2) of an exemplary SOT-MRAM device 1000. FIG. 9B depicts a simplified cross-sectional view of an active horizontal array comprising MTJs 321, during a reset operation illustrated in FIG. 9A. In the discussion below, reference will be made to both FIG. 9A and FIG. 9B. At step 910 of the exemplary method in FIG. 9A, all bit lines (e.g., bit line 50C1, bit line 50C2, bit line 50C3, bit line 50Cd, etc.) may be set to ground. At step 920, all source lines (e.g., source line 90C1, source line 90C2, source line 90C3, source line 90Cd, etc.) may also be set to ground. Then, at step 930, voltage may be applied to word line 60R2 to activate the horizontal array at R2 and the rest of the word lines (e.g., word lines 60R1, 60R3, and 60R4 in FIG. 5) may be set to ground, as discussed above with reference to step 610 in FIG. 6A. For example, FIG. 5 shows the activated/selected horizontal array of memory cells at R2. Once the horizontal array at R2 has been activated, voltage may be applied to the source line 90C1, the source line 90Cd may be set to ground, and the rest of the source lines (e.g., source line 90C2, source line 90C3, etc. that are between source line 90C1 and source line 90Cd) may be set to float. Due to the voltage potential difference created between the source line 90C1 and the source line 90Cd, an SOT write current 95RS may be generated as illustrated in FIG. 9B, traveling from the source line 90C1, through the shared SOT write line 70R2, toward the source line 90Cd. The generated SOT write current 95RS may reset all MTJs 321 of the horizontal array at R2, except the MTJ 321 of the dummy cell at R2/Cd. In other words, the magnetization direction of the free regions 10 in the horizontal array at R2 may all be switched to the same direction (i.e., out of the page), except the free region 10 of the dummy column Cd.

Conversely, a "set" operation may be performed by applying voltage to the source line 90Cd, setting the source line 90C1 to ground, and setting the rest of the source lines (e.g., source line 90C2, source line 90C3, etc. that are between source line 90Cd and source line 90C1) to float. This will generate an SOT write current traveling from the source line 90Cd, through the shared SOT write line 70R2, toward the source line 90C1, to switch the magnetization direction of the free regions 10 in the horizontal array at R2 to the same direction (i.e., into the page), except the free region 10 of the dummy column Cd.

Figure 10:
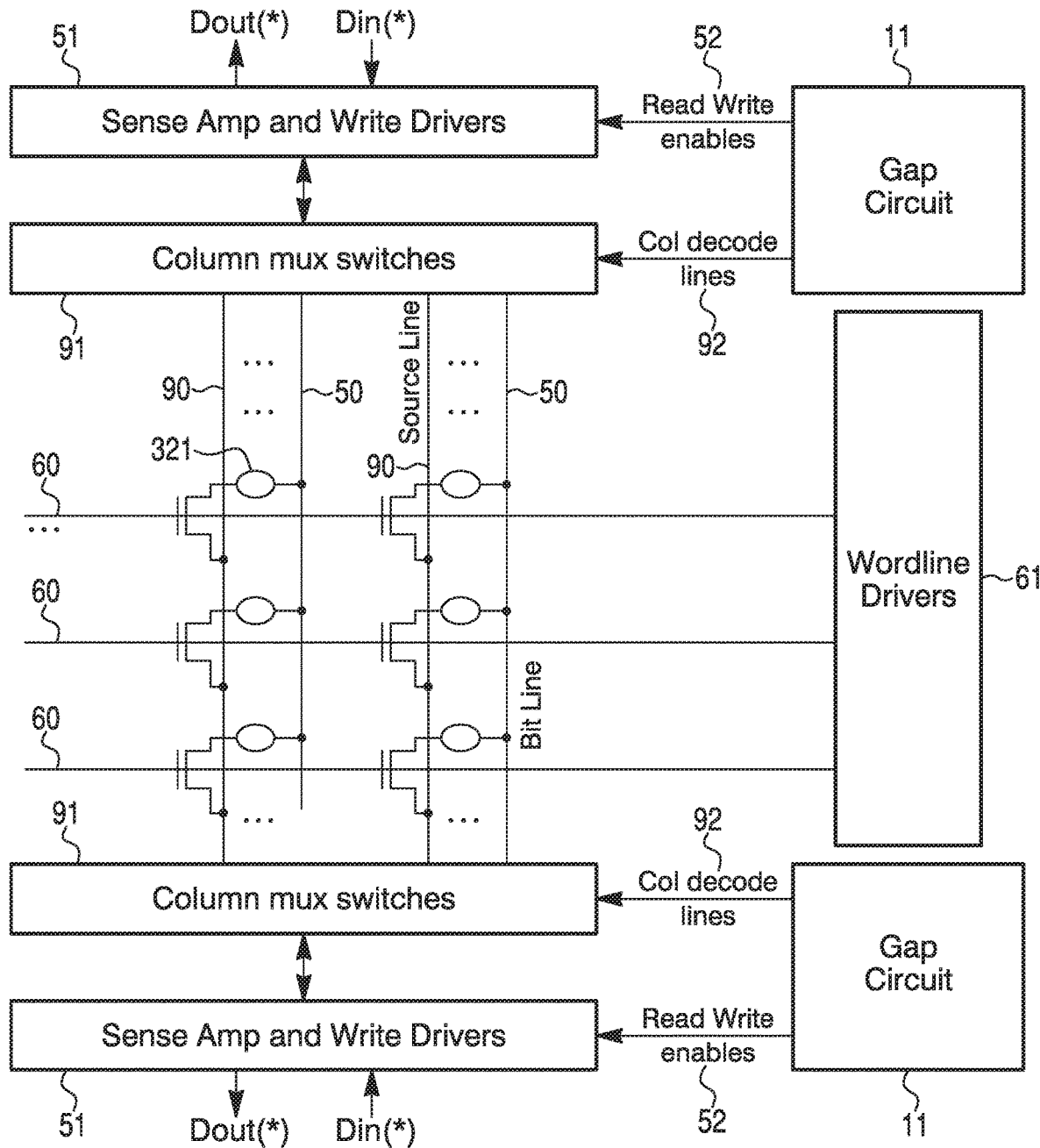
FIG. 10 depicts a simplified block diagram illustrating a memory architecture of an exemplary SOT-MRAM device, according to one aspect of the current disclosure.

With reference now to FIG. 10, there is depicted a simplified block diagram illustrating a memory architecture of an exemplary SOT-MRAM device 1000. In general, the memory architecture of the SOT-MRAM device 1000 may include word line drivers 61, column circuit controls 11, read/write circuits 51 comprising sense amplifiers and write drivers, and column multiplexer switches 91. Word line drivers 61 may generate appropriate word line voltages for word lines 60, in order to select/activate one or more word lines 60 to access MTJ(s) 321 along the selected word line(s) 60. Gap circuit 11 may generate and send address signals (e.g., column decode line signals 92, read/write enable signals 52, etc.) to column multiplexer switches 91 and read/write circuits 51 (e.g., sense amplifiers and write drivers) to, for example, allow for local decoding that determines which bit lines 50 and source lines 90 are to be driven for a particular operation (e.g., read, write, etc.). The local decoding may control the selective driving of the bit lines 50 and source lines 90 by the read/write circuits 51 and may also control the sense amplifiers' selective coupling to, or sensing of, the memory cells for determination of data bits stored therein. More particularly, the read/write enable signals 52 may each provide an indication as to whether memory cells included in the array are to be accessed for a particular operation (e.g., read, write, etc.). The column decode line signals 92 may control the column multiplexer switches 91 to select desired bit line 50 and source line 90 columns. The column multiplexer switches 91 may comprise bit line column multiplexer switches and source line column multiplexer switches. The bit line column multiplexer switches may be configured to provide a unidirectional read current and may be implemented with either a NMOS or a PMOS-type transistor. The source line column multiplexer switches may be configured to provide a bidirectional current and may be implemented with a transfer gate or auto-booted NMOS transistor.

As alluded to above, read/write circuit 51 may comprise sense amplifiers and write drivers, and may be coupled to bit lines and source lines, to provide appropriate voltages to certain bit lines 50 and source lines 90 used to perform an operation. The selection of the bit lines 50 and the source lines 90 that are driven is based on the address information received from the gap circuit 11, where the address information may be decoded and used to determine the memory cells to be accessed. If, for example, a target memory cell is included in a page to be accessed, the read/write circuit 51 may use the decoded address to selectively drive those bit lines 50 and source lines 90 suitable for accessing the corresponding MTJ 321.

Reading the state of an MTJ 321 and determining the bit represented by that state (i.e., a read operation, or a single bit read operation) may be performed by the read/write circuit 51, which may include a sense amplifier configured to sense a low power signal representing the stored bit and amplify it to a recognizable logic level. Further, reading the states of two MTJs 321 and determining the bit represented by those states (i.e., a differential bit read operation) may also be performed by the read/write circuit including the sense amplifier, the sense amplifier being configured to sense the low power signals representing the states of the MTJs 321 and determine the single bit represented by the differing states. Because these two MTJs 321 store complementary states, the comparison may be simple in that one MTJ 321 will have a relatively higher resistance than the other MTJ 321 producing an increased sense signal. As such, the magnitude of the resistance variation in a distribution of MTJs 321 is less important in the case of a differential bit read operation, relative to that of a single bit read operation. To perform the read operations discussed above, a sense amplifier may be connected to each column of MTJs 321 for reading the data values stored therein.

Figure 11:
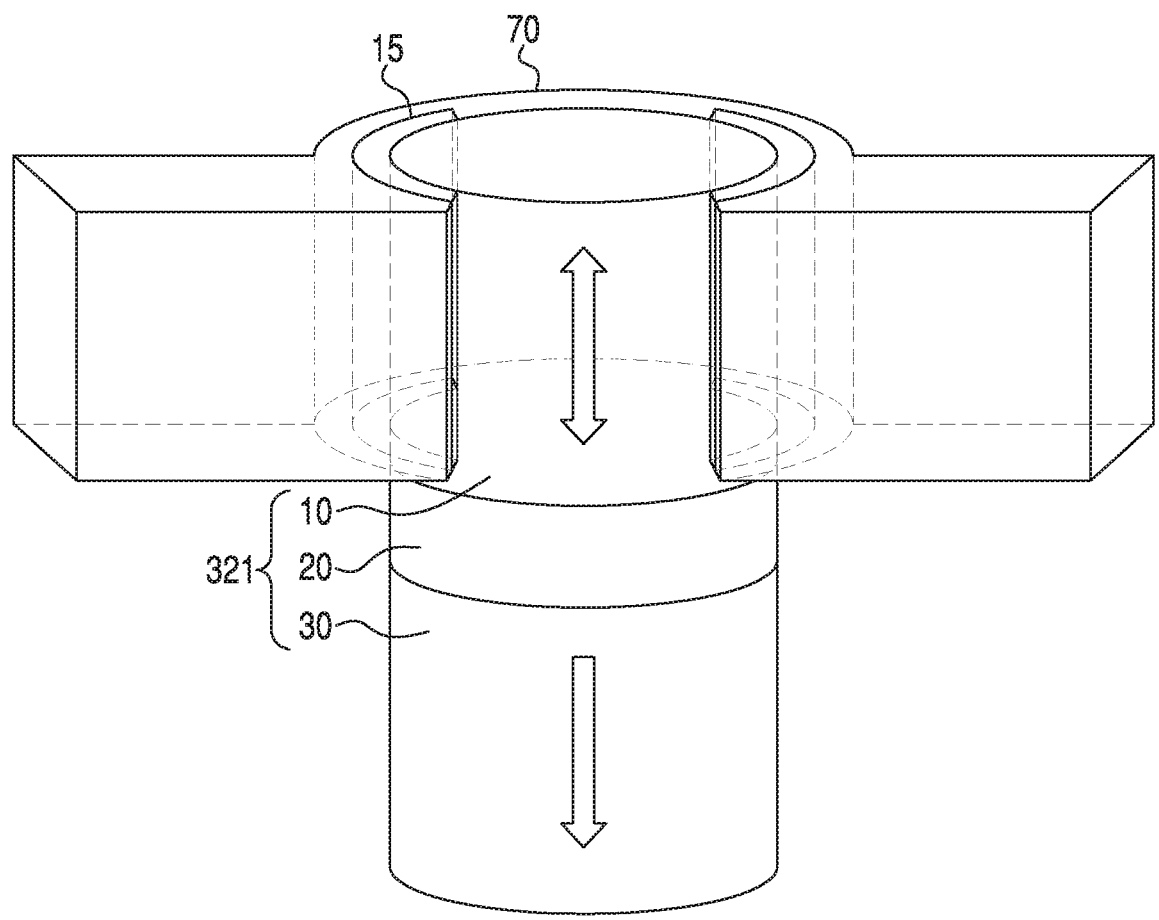
FIG. 11 is an enlarged perspective view of a portion of an exemplary SOT-MRAM device, according to one aspect of the current disclosure.

FIG. 11 depicts an enlarged perspective view of a portion of an exemplary SOT-MRAM device 1000. In particular, FIG. 11 illustrates an exemplary stack configuration of an MTJ 321 connected to a shared SOT write line 70 of the current disclosure. The MTJ 321 illustrated in FIG. 11, specifically the free region 10 of the MTJ 321 may utilize a high aspect ratio (e.g., have a height greater than or equal to a width or a diameter) or may be otherwise bar-shaped, so that the magnetization of the free region 10 has magnetic anisotropy oriented perpendicular to the substrate plane. Such an MTJ 321 may be referred to as a perpendicular MTJ or a pMTJ herein. It should be noted that, although certain regions depicted in FIG. 11 are cylindrical in shape, they may also have a rectangular, trapezoidal, pyramidal, or other shape.

Continuing with reference to FIG. 11, a magnetoresistive device may include an intermediate layer 20 disposed above and in contact with a fixed region 30. The intermediate layer 20 may include a dielectric material. A free region 10 may be above and in contact with the intermediate layer 20, opposite the fixed region 30. In some embodiments, an isolation layer 15 may be disposed between the free region 10 and shared SOT write line 70. In order to achieve high switching efficiency in an SOT-MRAM device, it is desired that the SOT write current mainly flows through the SOT write line 70 and not through the free region 10. The isolation layer 15 formed of material(s) with high electrical resistivity may prevent the SOT write current from flowing through or migrating to the free region 10, while allowing the spin current generated by the SOT write current to be injected into the free region 10 through the isolation layer 15. This spin current may contribute to a spin torque acting on the free region 10, in addition to the main spin torque generated at the direct interface between the SOT write line 70 and the free region 10. Therefore, the structure in FIG. 11 may lead to increased switching efficiency compared to, for example, a conventional structure depicted in FIG. 1. The isolation layer 15 may be in contact with both the free region 10 and the shared SOT write line 70. The isolation layer 15 may extend along the circumference of the free region 10, or may extend only partially along the circumference of the free region 10. In one embodiment, as illustrated in FIG. 11, a plurality of isolation layers 15 may be formed and spaced apart from each other along the circumference of the free region 10. Similarly, the shared SOT write line 70 may extend along the circumference of the free region 10, or may extend only partially along the circumference of the free region 10. The isolation layer 15 may have a thickness less than or equal to a thickness of the shared SOT write line 70. In some embodiments, isolation layer 15 may have a height greater than or equal to a height of the shared SOT write line 70. In one or more embodiments, the shared SOT write line 70 may have a non-uniform thickness. For example, as depicted in FIG. 11, portions of the shared SOT write line 70 may extend laterally outwards away from the free region 10. In some embodiments, as illustrated in FIG. 11, a plurality of isolation layers 15 (e.g., two isolation layers 15) may be formed and spaced apart from each other along the circumference of the free region 10, and each of the plurality of isolations layers 15 may be positioned approximately between the laterally-extending portion of the shared SOT write line 70 and the portion of the free region 10 facing the laterally-extending portion of the shared SOT write line 70, in order to maintain the SOT write current to flow mainly through the shared SOT write line 70 and to prevent the SOT write current from flowing through (or migrating to) the free region 10. In one or more embodiments, portions of the shared SOT write line 70 may have a thickness sufficient to impart a spin current to the free region 10 with enough magnitude to change the magnetization direction of the free region 10. In some embodiments, a source line may be connected, by way of a via or an electrode, to one or more portions of the shared SOT write line 70 extending laterally away from the free region 10.

With continuing reference to FIG. 11, isolation layer 15 may extend from the top edge of the free region 10. In some embodiments, isolation layer 15 does not extend past the bottom edge of the free region 10. In other embodiments, isolation layer 15 may extend past the bottom edge of the shared SOT write line 70. In still other embodiments, isolation layer 15 may extend from the top edge of the free region 10 to the bottom edge of the fixed region 30. In still other embodiments, isolation layer 15 may extend from a position adjacent to (and in contact with) the free region 10 to a position adjacent to (and in contact with) the fixed region 30. In one or more embodiments, isolation layer 15 (and indirectly, shared SOT write line 70) may radially cover approximately 35°-320° of the free region 10 in a plane perpendicular to the interface of the isolation layer 15 and the free region 10, allowing electrons to circulate around a majority of the circumference of the free region 10. In some embodiments, when electrons flow along the shared SOT write line 70, a spin current may be imparted to the free region 10 in a direction perpendicular to the flow of electrons. In some embodiments, this flow of electrons imparts enough torque to switch the magnetization direction of the free region 10. In some embodiments, the magnetization direction of the free region 10 may be orthogonal to the direction of the current flow in the shared SOT write line 70 and parallel to the circumferential surface (i.e., vertical outer wall) of the free region 10, as indicated by the double-sided arrow in FIG. 11. The magnetization direction of the fixed region 30 may be parallel to the circumferential surface (i.e., vertical outer wall) of the fixed region 10, and may be fixed in one direction (e.g., downward or upward), as indicated by the downward arrow in FIG. 11.

Figure 12A:
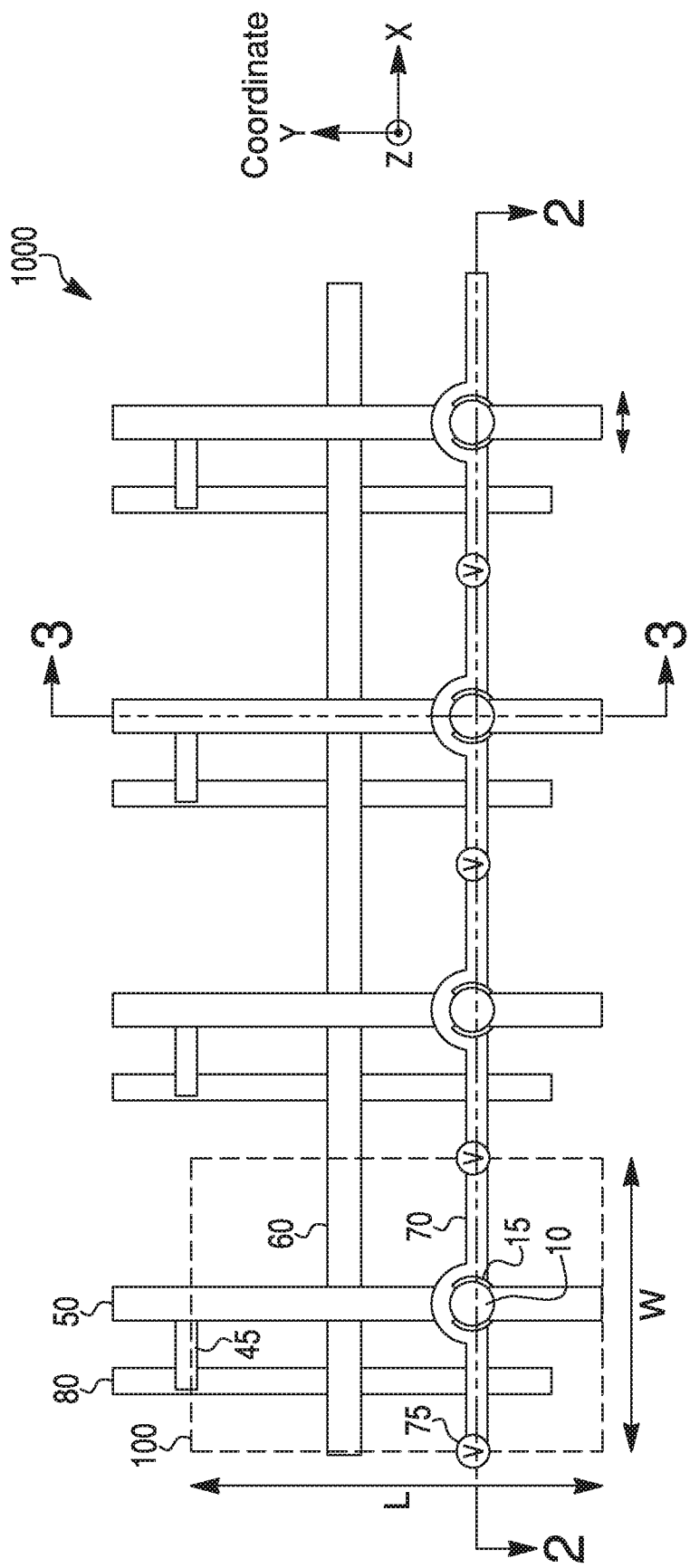
FIG. 12A depicts a plane view of a portion of an exemplary SOT-MRAM device, according to one aspect of the current disclosure.
Figure 12B:
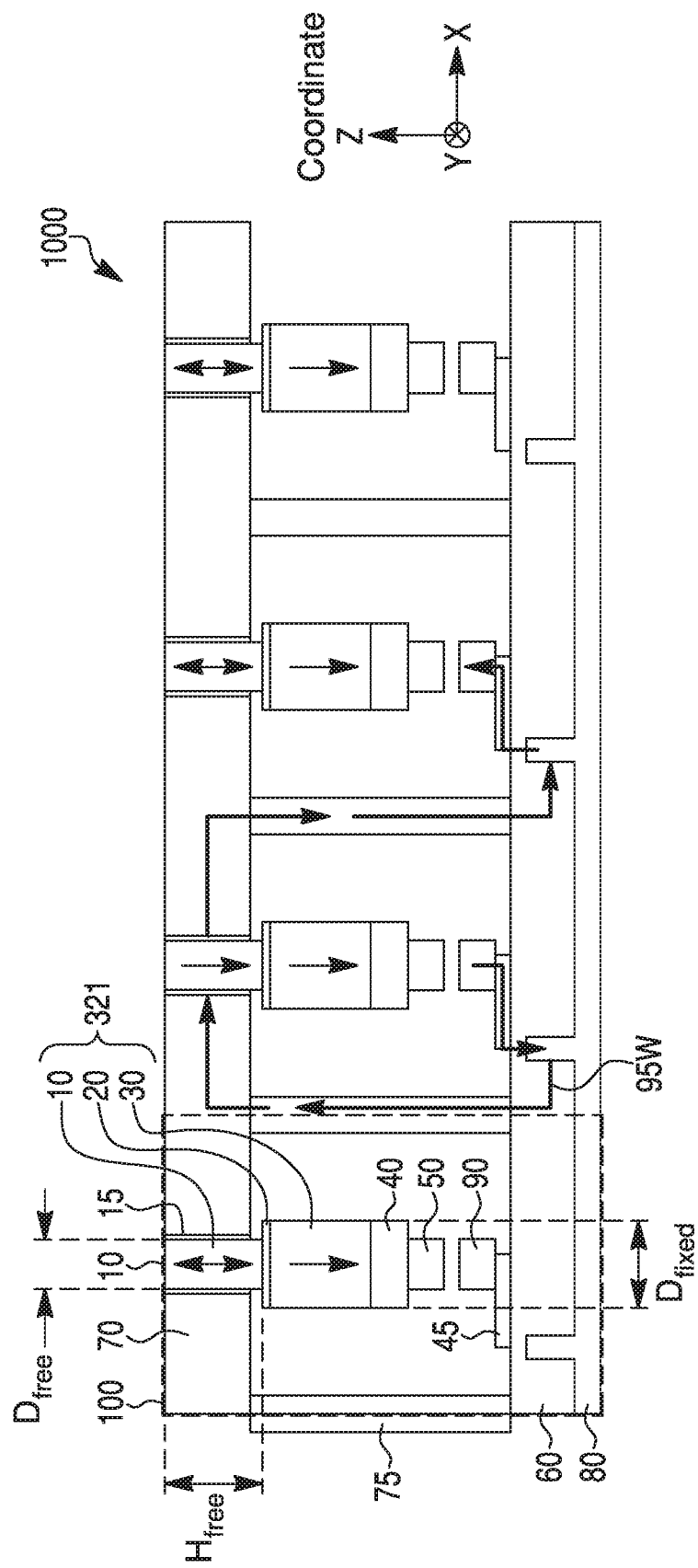
FIG. 12B depicts a cross-sectional view of a portion of an exemplary SOT-MRAM device, according to one aspect of the current disclosure.
Figure 12C:
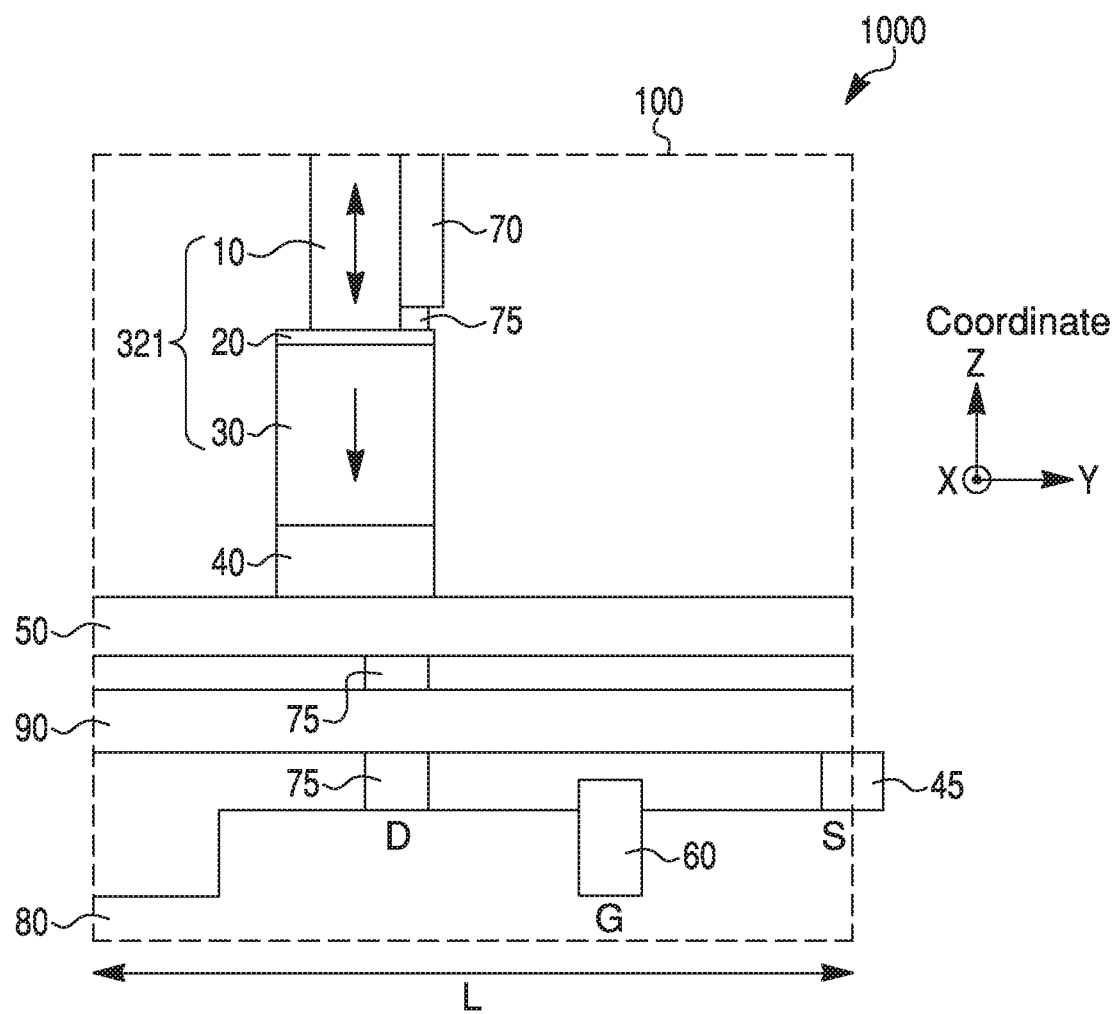
FIG. 12C depicts a cross-sectional view of a portion of an exemplary SOT-MRAM device, according to one aspect of the current disclosure.

FIGS. 12A-12C depict a plane view and cross-sectional views (along the plane 2-2 and the plane 3-3 identified in FIG. 12A, respectively) of a portion of an exemplary SOT-MRAM device 1000 including 1T1MTJ memory cells of the current disclosure. In particular, the exemplary device 1000 illustrated in FIGS. 12A-12C is implemented with a perpendicular MTJ (i.e., pMTJ) discussed above with reference to FIG. 11. However, as would be known to a person of ordinary skill in the art, the exemplary device 1000 may be implemented using any now-known or later-developed MTJs of varying configurations/structures. In the event that the pMTJ is implemented in the SOT-MRAM device 1000 as shown in FIGS. 12A-12C, the positioning of the bit line 50 and the MTJ 321 may differ from that of the exemplary SOT-MRAM devices 1000 depicted in FIGS. 2A-2C, 3, 6B, 7B, 8B, and 9B (i.e., devices utilizing in-plane MTJs). Notably, the shared SOT write line 70 and the MTJ 321 may be formed/positioned above the bit line 50. This configuration may bring increased switching efficiency as discussed above with reference to FIG. 11. In the discussion below, reference will be made to FIGS. 12A-12C.

As illustrated in FIG. 12A, each horizontal array of memory cells in the exemplary SOT-MRAM device may include multiple memory cells 100 spaced apart from each other horizontally. In one embodiment, each memory cell 100 may measure approximately 60 nm (nanometer) in width (i.e., W≈60 nm) and approximately 84 nm in length (i.e., L≈84 nm). Each memory cell 100 may include an MTJ 321 formed in a perpendicular MTJ stack configuration discussed above with reference to FIG. 11. The stack configuration of the MTJ 321 is more clearly shown in FIG. 12B. Notably, free region 10 may form the top layer of the MTJ 321 and may utilize a high aspect ratio (e.g., have a height greater than or equal to a diameter) or may be otherwise bar-shaped. For example, free region 10 may have a height measuring approximately from 15 nm to 20 nm (i.e., $H_{free} \approx$ 15-20 nm) and a diameter measuring approximately 10 nm (i.e., $D_{free} \approx$ 10 nm). Continuing with reference to FIG. 12B, in one embodiment, free region 10 may be formed above and in contact with an intermediate layer 20. Intermediate layer 20 may be formed above a fixed region 30, and may be disposed between the free region 10 and the fixed region 30. Fixed region 30 may have a diameter measuring approximately from 15 nm to 20 nm (i.e., $D_{fixed} \approx$ 15-20 nm). Diode 40 may be formed above and in contact with a bit line 50, and may be positioned between the fixed region 30 and the bit line 50. As discussed above with reference to FIGS. 7A-7B, by controlling the voltages applied to the supply lines (i.e., bit lines 50, source lines 90, and word lines 60), a read current may be generated and may travel from the bit line 50, through the diode 40, through a target MTJ 321, through the SOT line 70, through a via 75 which connects to the drain of the transistor 80, to the source of the transistor 80, through an interconnect 45 (e.g., electrode, via, etc.), and to the source line 90, in order to determine the resistive state of the target MTJ 321 (i.e., a read operation). Further, each bit line 50 may be connected to the diodes 40 of all the memory cells positioned along the respective column, as discussed above with reference to FIGS. 4-5.

Further, free regions 10 of all the MTJs 321 in the horizontal array may be formed proximate to or in contact with a shared SOT write line 70. In one embodiment, the shared SOT write line 70 may come in contact with each free region 10 along at least a portion of the circumference of the free region 10, as shown in FIG. 12A and also in FIG. 11. A plurality of isolation layers 15 may be disposed between each free region 10 and the shared SOT write line 70. In particular, as discussed above with reference to FIG. 11, each isolation layer 15 of the plurality of isolation layers 15 may be positioned approximately between the laterally-extending portion of the shared SOT write line 70 and the portion of the free region 10 facing the laterally-extending portion of the shared SOT write line 70, in order to maintain the SOT write current to flow mainly through the shared SOT write line 70 and to prevent the SOT write current from flowing through (or migrating to) the free region 10. In one embodiment, due to the application of the spin torque in a desired direction, the resultant magnetization direction of the free region 10 would be parallel to the circumferential surface (i.e., vertical outer wall) of the free region 10 and orthogonal to the current flow direction in the shared SOT write line 70, as indicated by the arrows in FIGS. 12B-12C. As discussed above, the shared SOT write line 70 may be in contact with the free regions 10 of all the MTJs 321 in the horizontal array. In each memory cell 100, the shared SOT write line 70 may be connected to the drain of a transistor 80 by way of via 75. In one embodiment, as shown in FIGS. 12A-12C, the transistor 80 may be a fin field-effect transistor (i.e., FinFET). As would be known to a person of ordinary skill in the art, FinFET is a nonplanar (i.e., three-dimensional), double-gate transistor built on a substrate (e.g., silicon on insulator). In FIG. 12B, via 75, which is in contact with the shared SOT line 70 at one end (e.g., top end of the via 75 in FIG. 12B), appears to be in contact with word line 60 at the other end (e.g., bottom end of the via 75 in FIG. 12B). However, this is because the contact point between the bottom end of the via 75 and the transistor 80 is obscured by the word line 60 in FIG. 12B. In reality, the bottom end of the via 75 may actually be in contact with the drain of the transistor 80, as shown in FIG. 12C. Continuing with reference to FIG. 12C, word line 60 may be in contact with the gate of the transistor 80. As discussed above, a voltage may be applied to word line 60 to "turn on" the transistor 80 to pass a current through. Further, word line 60 may be in contact with the gates of the transistors 80 of all the memory cells in the horizontal array (e.g., FIGS. 12A-12B). Therefore, applying a voltage to the word line 60 may activate/select the horizontal array for an operation, by "turning on" all the transistors 80 in the horizontal array. Further with reference to FIG. 12C, source line 90 may be in electrical contact with the source of the transistor 80, by way of an interconnect 45 (e.g., electrode, via, etc.) connected between the source line 90 and the source of the transistor 80. As discussed above with reference to FIGS. 6A-6B, a suitable source line voltage may be applied to one or more source lines 90 to drive a current through a desired portion of the shared SOT write line 70, in order to switch the magnetization direction of a target free region 10 during, for example, a write operation. FIG. 12B shows an SOT write current 95W, flowing from one source line toward another source line, through a portion of the shared SOT write line 70 adjacent to a target MTJ 321. Further, each source line 90 may be connected to the sources of the transistors 80 of all the memory cells positioned along the respective column, as discussed above with reference to FIGS. 4-5.

It should be noted that although FIGS. 12A-12C each illustrate just four memory cells 100 in a horizontal array, this is only for the sake of simplicity and clarity. As will be known to a person of ordinary skill in the art, any number of memory cells 100 may be included in a horizontal array. Further, the resultant SOT-MRAM device may include any number of such horizontal arrays arranged in rows.

While exemplary embodiments have been presented above, it should be appreciated that many variations exist. Furthermore, while the description uses spin-torque MRAM devices that include memory cells in a specific example arrangements, the teachings may be applied to other memory devices having different architectures in which the same concepts can be applied. Thus, the particular embodiments disclosed above are illustrative only and should not be taken as limitations, as the embodiments may be modified and practiced in different but equivalent manners apparent to those skilled in the art having the benefit of the teachings herein. Accordingly, the foregoing description is not intended to limit the disclosure to the particular form set forth, but on the contrary, is intended to cover such alternatives, modifications and equivalents as may be included within the spirit and scope of the inventions as defined by the appended claims so that those skilled in the art should understand that they can make various changes, substitutions and alterations without departing from the spirit and scope of the inventions in their broadest form.

In one embodiment, the present disclosure is drawn to a magnetoresistive memory comprising: a plurality of magnetoresistive memory devices, wherein each magnetoresistive memory device includes a fixed magnetic region, a free magnetic region, and an intermediate region disposed in between the fixed and free magnetic regions; and a first conductor extending adjacent each magnetoresistive memory device of the plurality of magnetoresistive devices, wherein the first conductor is in electrical contact with the free magnetic region of each magnetoresistive memory device.

Various aspects of the present disclosure may include one or more of the following features: the intermediate region may include a dielectric material; the fixed magnetic region of each magnetoresistive memory device may be electrically connected to a second conductor; a select device may electrically connect the fixed magnetic region of each magnetoresistive memory device to the second conductor; a select device may electrically connect the fixed magnetic region of each magnetoresistive memory device to the second conductor, wherein the select device is a diode; a select device may electrically connect the fixed magnetic region of each magnetoresistive memory device to the second conductor, wherein the select device is a transistor; each magnetoresistive memory device of the plurality of magnetoresistive memory devices may include a magnetic tunnel junction; a magnetization direction of the free magnetic region may be parallel to a direction of current flowing in the first conductor; a magnetization direction of the free magnetic region may be perpendicular to a direction of current flowing in the first conductor; and the free magnetic region may include a high aspect ratio.

In another embodiment, the present disclosure is drawn to a magnetoresistive memory comprising: a memory array including a plurality of magnetoresistive memory devices, wherein a first set of magnetoresistive memory devices of the plurality of magnetoresistive memory devices is arranged in a first row, wherein each magnetoresistive memory device of the first set of magnetoresistive memory devices includes a first magnetic region, a second magnetic region, and an intermediate region disposed in between the first and second magnetic regions; and a first conductor disposed adjacent to each magnetoresistive memory device of the first set of magnetoresistive memory devices, wherein a portion of the first conductor is in electrical contact with the first magnetic region of each magnetoresistive memory device of the first set of magnetoresistive memory devices, and wherein the first conductor is electrically coupled to a plurality of second conductors via respective first select devices.

Various aspects of the present disclosure may include one or more of the following features: the magnetoresistive memory may further comprise a plurality of third conductors and a plurality of second select devices, wherein each third conductor of the plurality of third conductors is coupled to a respective second magnetic region of each magnetoresistive memory device of the first set of magnetoresistive memory devices via a respective second select device of the plurality of second select devices; the magnetoresistive memory may further comprise a plurality of third conductors and a plurality of second select devices, wherein each third conductor of the plurality of third conductors is coupled to a respective second magnetic region of each magnetoresistive memory device of the first set of magnetoresistive memory devices via a respective second select device of the plurality of second select devices, and wherein the plurality of second select devices are diodes; the first magnetic region may include a magnetization configured to transition between a first direction and a second direction when exposed to a spin orbit torque; the first magnetic region may include a magnetization configured to transition between a first direction and a second direction when exposed to a spin orbit torque, and the second magnetic region may include a magnetization configured to remain fixed when exposed to the spin orbit torque; the intermediate region may include a dielectric material; each magnetoresistive memory device of the plurality of magnetoresistive memory devices may include a magnetic tunnel junction; and the first magnetic region may include a high aspect ratio.

In yet another embodiment, the present disclosure is drawn to a magnetoresistive memory, comprising: a plurality of magnetoresistive memory devices, wherein each magnetoresistive memory device includes a fixed magnetic region, a free magnetic region, and an intermediate region disposed in between the fixed and free magnetic regions, wherein the free magnetic region is formed above the fixed magnetic region; and a first conductor extending adjacent each magnetoresistive memory device of the plurality of magnetoresistive devices, wherein the first conductor is in electrical contact with the free magnetic region of each magnetoresistive memory device.

Various aspects of the present disclosure may include one or more of the following features: the fixed magnetic region of each magnetoresistive memory device may be electrically connected to a second conductor, wherein the second conductor is formed below the fixed magnetic region; a select device may electrically connect the fixed magnetic region of each magnetoresistive memory device to the second conductor, wherein the select device is a diode; the free magnetic region may include a high aspect ratio; and one or more isolation layers may be disposed in between the free magnetic region and the first conductor, wherein the one or more isolation layers comprise electrically resistive material.

The foregoing description of the inventions has been described for purposes of clarity and understanding. It is not intended to limit the inventions to the precise form disclosed. Various modifications may be possible within the scope and equivalence of the application.

We claim:

1. A magnetoresistive memory, comprising:
   a plurality of magnetoresistive memory devices, wherein each magnetoresistive memory device includes a fixed magnetic region, a free magnetic region, and an intermediate region disposed in between the fixed and free magnetic regions, wherein the free magnetic region is formed above the fixed magnetic region; and
   a first conductor extending adjacent each magnetoresistive memory device of the plurality of magnetoresistive devices, wherein the first conductor is in electrical contact with the free magnetic region of each magnetoresistive memory device,
   wherein one or more isolation layers are disposed in between the free magnetic region and the first conductor, each of the one or more isolation layers being in contact with the free magnetic region and the first conductor, the first conductor being a write line separate from a bit line, wherein the one or more isolation layers comprise electrically resistive material, and wherein each of the one or more isolation layers extends partially along a circumference of the free magnetic region.

2. The magnetoresistive memory of claim 1, wherein the fixed magnetic region of each magnetoresistive memory device is electrically connected to a second conductor, the second conductor being the bit line, wherein the second conductor is formed below the fixed magnetic region.

3. The magnetoresistive memory of claim 2, wherein a select device electrically connects the fixed magnetic region of each magnetoresistive memory device to the second conductor, wherein the select device is a diode.

4. The magnetoresistive memory of claim 1, wherein the free magnetic region includes a high aspect ratio.

5. The magnetoresistive memory of claim 1, wherein a height of each of the one or more isolation layers is greater than or equal to a height of the first conductor.

* * * * *